(12) United States Patent
Bao et al.

(10) Patent No.: US 12,236,899 B2
(45) Date of Patent: Feb. 25, 2025

(54) DISPLAY PANEL AND METHOD FOR PREPARING SAME, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Zheng Bao, Beijing (CN); Mingqiang Wang, Beijing (CN); Ziqian Li, Beijing (CN); Yi Zhang, Beijing (CN); Xiangdong Wei, Beijing (CN); Gong Chen, Beijing (CN); Haotian Yang, Beijing (CN); Chang Wang, Beijing (CN); Jiaxiang Zhang, Beijing (CN); Bin Zhang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 18/578,731

(22) PCT Filed: Jun. 6, 2022

(86) PCT No.: PCT/CN2022/097171
§ 371 (c)(1),
(2) Date: Jan. 12, 2024

(87) PCT Pub. No.: WO2023/236012
PCT Pub. Date: Dec. 14, 2023

(65) Prior Publication Data
US 2024/0339084 A1    Oct. 10, 2024

(51) Int. Cl.
G09G 3/3275    (2016.01)
H10K 59/12    (2023.01)
(Continued)

(52) U.S. Cl.
CPC ....... G09G 3/3275 (2013.01); H10K 59/1201 (2023.02); H10K 59/1213 (2023.02);
(Continued)

(58) Field of Classification Search
CPC ................... G09G 3/3275; G09G 3/32; G09G 2300/0426; G09G 2310/08;
(Continued)

(56) References Cited

U.S. PATENT DOCUMENTS 9,672,776 B2    6/2017  Guo et al.
10,242,634 B2   3/2019  Sang et al.
(Continued)

FOREIGN PATENT DOCUMENTS

CN    104505038 A    4/2015
CN    105590600 A    5/2016
(Continued)

OTHER PUBLICATIONS

International Search Report and Written Opinion mailed on Dec. 7, 2022, in corresponding PCT/CN2022/097171, 10 pages.

*Primary Examiner* — Brent D Castiaux
(74) *Attorney, Agent, or Firm* — XSENSUS LLP

(57) ABSTRACT

The present disclosure provides a display panel, a method for preparing the same, and a display device. The display panel includes pixel units distributed in an array in a display area, where the pixel units include sub-pixels, at least one of which has a maximum grayscale value voltage different from a maximum grayscale value voltage of the other sub-pixel; and a switching circuit including switching units on a side of the display area, where one end of the switching unit is connected to a data line. In two adjacent columns of pixel units, two sub-pixels having the same maximum grayscale value voltage are connected to two adjacent switching units through data lines, respectively.

20 Claims, 15 Drawing Sheets

(51) Int. Cl.
*H10K 59/121* (2023.01)
*H10K 59/131* (2023.01)
*H10K 71/60* (2023.01)

(52) U.S. Cl.
CPC ........... *H10K 59/131* (2023.02); *H10K 71/60* (2023.02); *G09G 2300/0426* (2013.01); *G09G 2310/08* (2013.01); *G09G 2330/023* (2013.01)

(58) Field of Classification Search
CPC ......... G09G 2330/023; H10K 59/1201; H10K 59/1213; H10K 59/131; H10K 71/60
See application file for complete search history.

(56) References Cited

U.S. PATENT DOCUMENTS

| | | | |
|---|---|---|---|
| 2016/0189640 A1 | 6/2016 | Guo et al. | |
| 2016/0189671 A1* | 6/2016 | Kim | G09G 3/3291 345/82 |
| 2016/0322008 A1 | 11/2016 | Sang et al. | |
| 2017/0243528 A1 | 8/2017 | Ji et al. | |
| 2020/0410940 A1* | 12/2020 | Kim | G09G 3/3275 |
| 2022/0036829 A1* | 2/2022 | Jeong | G09G 3/3275 |

FOREIGN PATENT DOCUMENTS

| | | |
|---|---|---|
| CN | 106097988 A | 11/2016 |
| CN | 106950772 A | 7/2017 |
| CN | 106950772 B | 12/2019 |
| CN | 113870762 A | 12/2021 |
| CN | 114067756 A | 2/2022 |
| EP | 3089150 A1 | 11/2016 |
| GB | 2547576 A | 8/2017 |
| GB | 2547576 B | 8/2021 |
| JP | 2008-039843 A | 2/2008 |
| JP | 5028900 B2 | 9/2012 |

\* cited by examiner

T10

T9

DISPLAY PANEL AND METHOD FOR PREPARING SAME, AND DISPLAY DEVICE

CROSS-REFERENCE TO RELATED APPLICATION

The present application is the U.S. National phase application of International Application No. PCT/CN2022/097171, filed on Jun. 6, 2022, the entire contents of which are hereby incorporated by reference in its entirety.

TECHNICAL FIELD

The present disclosure relates to the field of display technologies, and in particular, to a display panel, a method for preparing the display panel, and a display device.

BACKGROUND

In an Organic Light Emitting Diode (OLED) display panel, each sub-pixel is driven to emit light by a corresponding pixel driver circuit. In the related art, the data signal voltage on the data line is unstable, which affects the display image quality.

It should be noted that the above information disclosed in the "BACKGROUND" section is intended only to enhance the understanding of the background of this disclosure, and therefore it may include information that does not constitute prior art known to those of ordinary skill in the art.

SUMMARY

The purpose of the present disclosure is to overcome the deficiencies of the above prior art and to provide a display panel, a method for preparing the display panel, and a display device.

According to an aspect of the present disclosure, there is provided a display panel. The display panel includes: a display area including a plurality of pixel units distributed in an array along a row direction and a column direction, where the plurality of pixel units include at least a first sub-pixel and a second sub-pixel, and a maximum grayscale value voltage of the first sub-pixel is less than a maximum grayscale value voltage of the second sub-pixel; a source driver circuit on a side of the display area, where the source driver circuit is configured to output a data signal and a switch control signal; and a switching circuit on a side of the display area, where the switching circuit includes a plurality of switching units, a control end of the switching unit is configured to receive the switch control signal, a first end of the switching unit is configured to receive the data signal, and a second end of the switching unit is connected to a data line. The first sub-pixel in any $n^{th}$ column of pixel units and the first sub-pixel in a $(n+1)^{th}$ column of pixel units are connected to two adjacent switching units through data lines, respectively, n being an odd number greater than or equal to 1.

In an embodiment of the present disclosure, the plurality of pixel units further include a third sub-pixel, and the second sub-pixel and the third sub-pixel in a same pixel unit are connected to two adjacent switching units or two switching units spaced apart through data lines, respectively.

In an embodiment of the present disclosure, the plurality of switching units are arranged in one-to-one correspondence with a plurality of columns of sub-pixels.

In an embodiment of the present disclosure, the display panel includes a plurality of repeating units distributed along the row direction, where the repeating unit includes a first pixel unit and a second pixel unit adjacent to each other in the row direction and six switching units of the plurality of switching units sequentially arranged in the row direction. In the repeating unit, the switching unit in a first column is connected to the data line of the first sub-pixel in the first pixel unit, and the switching unit in a second column is connected to the data line of the first sub-pixel in the second pixel unit.

In an embodiment of the present disclosure, the first sub-pixel is an R sub-pixel.

In an embodiment of the present disclosure, the switching unit is a transistor.

In an embodiment of the present disclosure, the switching circuit includes a plurality of ninth transistors and a plurality of tenth transistors, the plurality of ninth transistors and the plurality of tenth transistors being spaced apart in sequence. A sub-pixel of a $m^{th}$ column and a sub-pixel of a $(m+1)^{th}$ column are different sub-pixels in a pixel unit of a same column, the ninth transistor corresponding to the sub-pixel of the $m^{th}$ column is connected to a data line of the sub-pixel of the $m^{th}$ column, and the tenth transistor corresponding to the sub-pixel of the $(m+1)^{th}$ column is connected to a data line of a corresponding sub-pixel in a pixel unit of a next column, m being a positive integer greater than or equal to 1.

In an embodiment of the present disclosure, the tenth transistor is connected to the data line of the corresponding sub-pixel in the pixel unit of the next column through a transfer line, and the transfer line and the data line are in different conductive layers.

In an embodiment of the present disclosure, the display panel further includes: a base substrate including the display area; an active layer on a side of the base substrate, the active layer including: a plurality of fifth active portions, where the fifth active portion is configured to form a channel region for the tenth transistor; and a plurality of sixth active portions, where the sixth active portion is connected to a side of the fifth active portion; a first conductive layer on a side, away from the base substrate, of the active layer, wherein the first conductive layer includes: a plurality of second gate lines, where an orthographic projection of the second gate line on the base substrate covers an orthographic projection of the fifth active portion on the base substrate, and a portion of the second gate line is configured to form a gate of the tenth transistor; and a third conductive layer on a side, away from the base substrate, of the first conductive layer, where the third conductive layer includes: a plurality of data lines, where one of the plurality of data lines is connected to one column of sub-pixels; and a plurality of sixth conductive lines arranged in correspondence with the plurality of sixth active portions, the sixth conductive line being connected to the sixth active portion through a via hole; where the transfer line is connected to the sixth conductive line and a corresponding data line in an adjacent pixel unit through via holes, respectively.

In an embodiment of the present disclosure, the transfer line is in the first conductive layer.

In an embodiment of the present disclosure, an angle, between an orthographic projection of the transfer line on the base substrate and an orthographic projection of the sixth conductive line connected to the transfer line on the base substrate, is greater than or equal to 60° and less than or equal to 120°; and an angle formed by the orthographic projection of the transfer line on the base substrate intersecting an orthographic projection of the data line on the base substrate, is greater than or equal to 60° and less than or equal to 120°.

In an embodiment of the present disclosure, the active layer further includes a plurality of fourth active portions, wherein the fourth active portion is connected to a side, away from the sixth active portion, of the fifth active portion; the first conductive layer further includes a plurality of second connection lines, the second connection line being connected to the source driver circuit; and the third conductive layer further includes: a plurality of fourth conductive lines arranged in correspondence with the plurality of fourth active portions, where the fourth conductive line is connected to the corresponding fourth active portion through a via hole; and a plurality of third conductive lines arranged in correspondence with the plurality of second connection lines, where the third conductive line is connected to the corresponding second connection line through a via hole. The display panel further includes a second conductive layer between the first conductive layer and the third conductive layer, where the second conductive layer includes a plurality of second transfer portions arranged in correspondence with the plurality of fifth active portions, where an orthographic projection of the second transfer portion on the base substrate is between an orthographic projection of the fourth active portion on the base substrate and an orthographic projection of the second connection line on the base substrate, and the second transfer portion is connected to the corresponding third conductive line and the corresponding fourth conductive line through via holes, respectively.

In an embodiment of the present disclosure, the active layer further includes: a plurality of second active portions, where an orthographic projection of the second active portion on the base substrate is in an non-display area, and the second active portion is configured to form a channel region for the ninth transistor; a plurality of first active portions arranged in correspondence with the plurality of second active portions, where the first active portion is connected to a side of the second active portion; and a plurality of third active portions arranged in correspondence with the plurality of second active portions, where the third active portion is connected to a side, away from the first active portion, of the second active portion, and where the second active portion is connected to a corresponding data line through a via hole; the first conductive layer further includes: a plurality of first gate lines, wherein an orthographic projection of the first gate line on the base substrate covers the orthographic projection of the second active portion on the base substrate, and a portion of the first gate line is configured to form a gate of the ninth transistor; and a plurality of first connection lines, the first connection line being connected to the source driver circuit; the second conductive layer further includes: a plurality of first transfer portions arranged in correspondence with the plurality of second active portions, where an orthographic projection of the first transfer portion on the base substrate is between an orthographic projection of the first active portion on the base substrate and an orthographic projection of the first connection line on the base substrate; and the third conductive layer further includes: a plurality of first conductive lines, where the first conductive line is connected to the corresponding first active portion and the corresponding first transfer portion through via holes; and a plurality of second conductive lines, where the second conductive line is connected to the corresponding first connection line and the corresponding first transfer portion through via holes.

In an embodiment of the present disclosure, the switching circuit includes a plurality of switch selection circuits, and the plurality of switch selection circuits include the plurality of switching units.

According to a second aspect of the present disclosure, there is further provided a method for preparing a display panel, which is configured to prepare the display panel as described in the above embodiments of the present disclosure. The method includes: providing the base substrate, where the base substrate includes the display area and a non-display area at least partially surrounding the display area; forming the active layer in the non-display area on a side of the base substrate using a deposition process, where the active layer includes the fifth active portion and the sixth active portion connected to a side of the fifth active portion, the fifth active portion being configured to form the channel region for the tenth transistor; forming the first conductive layer on a side, away from the base substrate, of the active layer using a deposition process, where the first conductive layer includes the plurality of second gate lines and the plurality of transfer lines, where the orthographic projection of the second gate line on the base substrate covers the orthographic projection of the fifth active portion on the base substrate, and a portion of the second gate line is configured to form the gate for the tenth transistor, and where the transfer line is connected to the sixth conductive line and a corresponding data line in an adjacent pixel unit through via holes, respectively; and forming the third conductive layer on a side, away from the base substrate, of the first conductive layer using a deposition process, where the third conductive layer includes the plurality of data lines and the plurality of sixth conductive lines, one of the plurality of data lines is connected to one column of sub-pixels, and the plurality of sixth conductive lines are arranged in correspondence with the plurality of sixth active portions, and the sixth conductive line is connected to the sixth active portion through a via hole.

In an embodiment of the present disclosure, before forming the first conductive layer on the side, away from the base substrate, of the active layer using the deposition process, the method further includes: forming a first gate insulating layer by depositing a first inorganic material on the base substrate and the active layer using a deposition process; where forming the first conductive layer on the side, away from the base substrate, of the active layer using the deposition process includes: forming the first conductive layer by depositing a first conductive material on the first gate insulating layer using the deposition process.

In an embodiment of the present disclosure, after forming the first conductive layer on the side, away from the base substrate, of the active layer using the deposition process, the method further includes: forming a second gate insulating layer by depositing a second inorganic material on the first conductive layer using a deposition process; forming a second conductive layer by depositing a first conductive material on the second gate insulating layer using a deposition process; forming a plurality of second transfer portions in the second conductive layer using a compositional process, where the plurality of second transfer portions are arranged in correspondence with the plurality of fifth active portions, an orthographic projection of the second transfer portion on the base substrate is between an orthographic projection of a fourth active portion on the base substrate and an orthographic projection of a second connection line on the base substrate, and the second transfer portion is connected to a corresponding third conductive line and a corresponding fourth conductive line through via holes, respectively; forming an interlayer dielectric layer by depositing a first inorganic material or a second inorganic material on the second conductive layer using a deposition process; and forming a plurality of via holes in the interlayer dielectric layer using an etching process.

In an embodiment of the present disclosure, forming the third conductive layer on the side, away from the base substrate, of the first conductive layer using the deposition process includes: forming the third conductive layer by depositing a second conductive material on the interlayer dielectric layer using the deposition process; and forming the plurality of data lines and the plurality of sixth conductive lines on the third conductive layer using an etching process.

In an embodiment of the present disclosure, after forming the third conductive layer, the method further includes: planarizing the third conductive layer.

According to a third aspect of the present disclosure, there is further provided a display device including the display panel as described in any one of embodiments of the present disclosure.

It should be understood that the above general description and the following detailed descriptions are exemplary and explanatory only and do not limit the present disclosure.

BRIEF DESCRIPTION OF THE DRAWINGS

The accompanying drawings herein are incorporated into and form part of the specification, show embodiments that are consistent with the present disclosure, and are used in conjunction with the specification to explain the principles of the present disclosure. It will be apparent that the accompanying drawings in the following description are only some of embodiments of the present disclosure, and that other drawings may be obtained from these drawings without creative effort by those of ordinary skill in the art.

DETAILED DESCRIPTION

Figure 1:
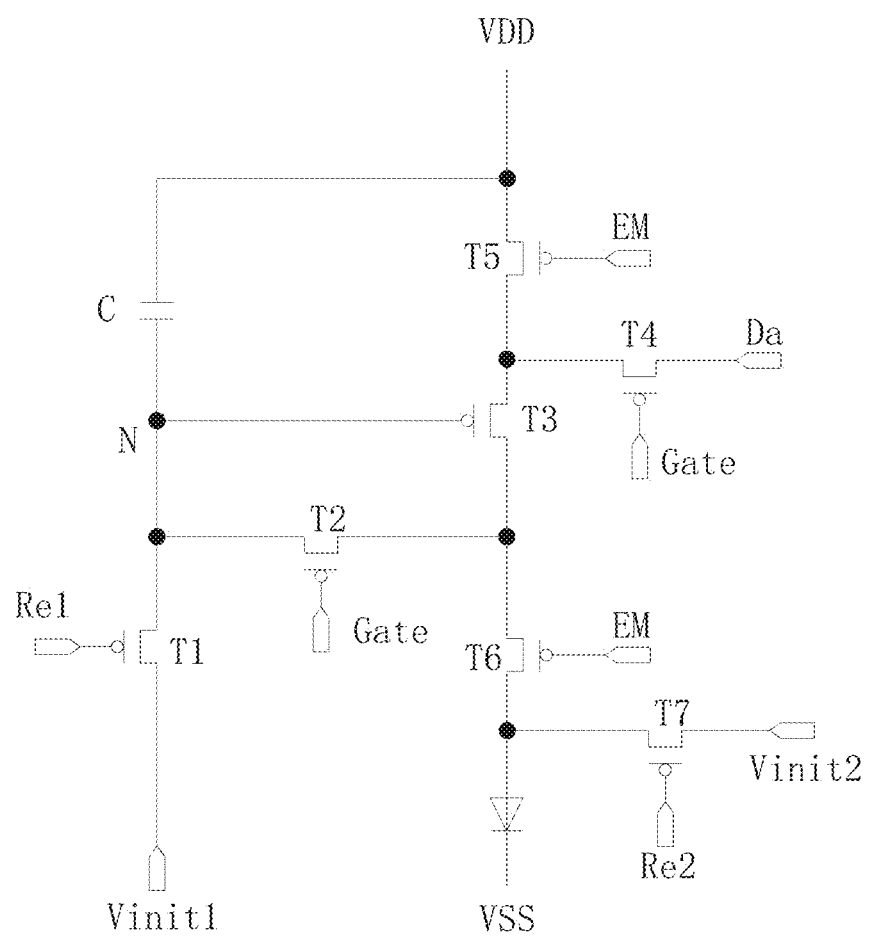
FIG. 1 is a schematic diagram of a circuit structure of a pixel driver circuit in a display panel according to an embodiment of the present disclosure.

Embodiments will now be described more fully with reference to the accompanying drawings. However, the embodiments can be implemented in a variety of forms and should not be construed as being limited to the embodiments set forth herein; rather, the provision of these embodiments makes the present disclosure comprehensive and complete and conveys the concept of the embodiments to those skilled in the art in a comprehensive manner. The same reference numerals in the drawings indicate the same or similar structures, and thus their detailed description will be omitted. In addition, the accompanying drawings are only schematic illustrations of the present disclosure and are not necessarily drawn to scale.

A display area of a display panel of the present disclosure includes pixel units distributed in an array along a row direction and a column direction, where each pixel unit may have a plurality of sub-pixels, and each sub-pixel may be provided with a driving current by a corresponding pixel driver circuit so as to be driven to emit light and be displayed. The pixel driver circuit in the display panel of the present disclosure may be a 4T1C, 5T1C, 5T2C, 6T1C, or 7T1C structure, or the like. In an embodiment of the present disclosure, the pixel driver circuit is a 7T1C structure, and FIG. 1 is a schematic diagram of a circuit structure of the pixel driver circuit in a display panel according to an embodiment of the present disclosure. The pixel driver circuit may include a first transistor T1, a second transistor T2, a driver transistor T3, a fourth transistor T4, a fifth transistor T5, a sixth transistor T6, a seventh transistor T7, and a capacitor C. A first electrode of the first transistor T1 is connected to a node N, a second electrode of the first transistor T1 is connected to a first initial signal terminal Vinit1, and a gate of the first transistor T1 is connected to a reset signal terminal Re1. A first electrode of the second transistor T2 is connected to a first electrode of the driver transistor T3, a second electrode of the second transistor T2 is connected to the node N, and a gate of the second transistor T2 is connected to a gate drive signal terminal Gate. A gate of the driver transistor T3 is connected to the node N. A first electrode of the fourth transistor T4 is connected to a data signal terminal Da, a second electrode of the fourth transistor T4 is connected to a second electrode of the driver transistor T3, and a gate of the fourth transistor T4 is connected to a gate drive signal terminal Gate. A first electrode of the fifth transistor T5 is connected to the second electrode of the driver transistor T3, a second electrode of the fifth transistor T5 is connected to a first power supply terminal VDD, and a gate of the fifth transistor T5 is connected to an enable signal terminal EM. A first electrode of the sixth transistor T6 is connected to the first electrode of the driver transistor T3, and a gate of the sixth transistor T6 is connected to an enable signal terminal EM. A first electrode of the seventh transistor T7 is connected to a second electrode of the sixth transistor T6, a second electrode of the seventh transistor T7 is connected to a second initial signal terminal Vinit2, and a gate of the seventh transistor T7 is connected to a reset signal terminal Re2. The capacitor C is connected between the gate of the driver transistor T3 and the first power supply terminal VDD. The pixel driver circuit may be connected to a light-emitting unit OLED and configured to drive the light-emitting unit OLED to emit light, where the light-emitting unit OLED may be connected between the second electrode of the sixth transistor T6 and a second power supply terminal VSS. The transistors T1-T7 may all be P-type transistors or N-type transistors, or some of the transistors T1-T7 may be P-type transistors and some of the transistors T1-T7 may be N-type transistors. For example, the first transistor T1 to the seventh transistor T7 are all P-type transistors or all N-type transistors, or, alternatively, the first transistor T1 and the second transistor T2 are P-type transistors, and the third transistor T3 to the seventh transistor T7 are N-type transistors, and the like.

It should be noted that the transistors in the embodiments of the present disclosure may all be thin-film transistors or field-effect transistors, or other devices with the same characteristics. In this specification, the first electrode may be a drain electrode and the second electrode may be a source electrode, or, the first electrode may be a source electrode and the second electrode may be a drain electrode.

Figure 2:
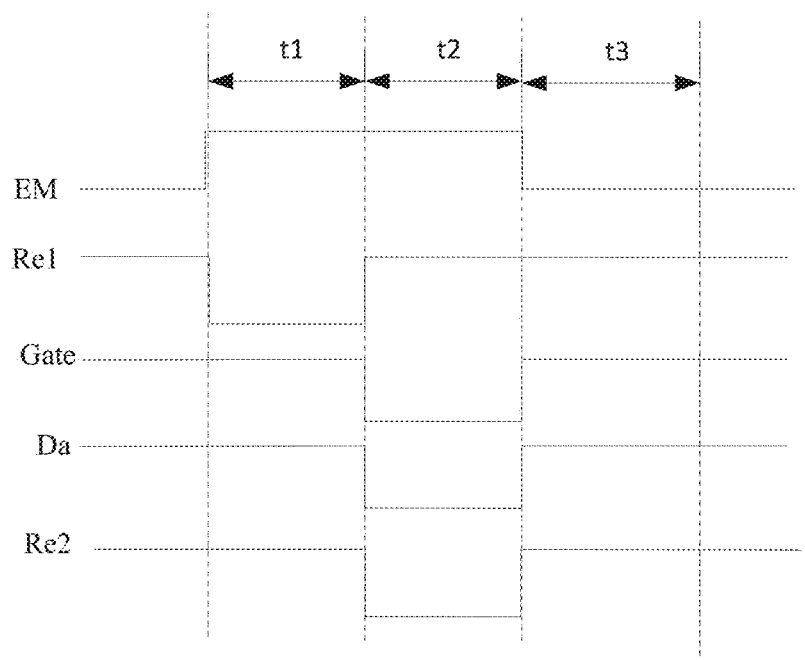
FIG. 2 is a timing diagram of each node in a driving method of the pixel driver circuit of FIG. 1.

FIG. 2 is a timing diagram of each node in a driving method of the pixel driver circuit of FIG. 1. "Gate" denotes the timing of the gate drive signal terminal Gate. "Re1" denotes the timing of the reset signal terminal Re1. "Re2" denotes the timing of the reset signal terminal Re2. "EM" denotes the timing of the enable signal terminal EM. "Da" denotes the timing of the data signal terminal Da. The driving method of the pixel driver circuit may include a reset phase t1, a compensation phase t2, and a light-emitting phase t3. In the reset phase t1: the reset signal terminal Re1 outputs a low-level signal, the first transistor T1 is turned on, and the first initial signal terminal Vinit1 inputs an initial signal to the node N. In the compensation phase t2: the reset signal terminal Re2 and the gate drive signal terminal Gate output low-level signals, the fourth transistor T4, the second transistor T2 and the seventh transistor T7 are turned on, and at the same time, the data signal terminal Da outputs a drive signal to write a voltage Vdata+Vth to the node N, where Vdata is the voltage of the drive signal and Vth is the threshold voltage of the driver transistor T3, and the second initial signal terminal Vinit2 inputs an initial signal to the second electrode of the sixth transistor T6. In the light-emitting phase t3: the enable signal terminal EM outputs a low-level signal, the sixth transistor T6 and the fifth transistor T5 are turned on, and the driver transistor T3 emits light under the action of the voltage Vdata+Vth stored in the capacitor C. According to the output current formula of the driver transistor, $I=(\mu W C_{ox}/2L)(V_{gs}-V_{th})^2$, where $\mu$ is the carrier mobility, $C_{ox}$ is the gate capacitance per unit area, W is the width of the channel of the driver transistor, L is the length of the channel of the driver transistor, Vgs is the voltage difference between the gate and the source of the driver transistor, and Vth is the threshold voltage of the driver transistor. The output current I of the driver transistor in the pixel driver circuit of the present disclosure is equal to $(\mu W C_{ox}/2L)(Vdata+Vth-Vdd-Vth)^2$. This pixel driver circuit can avoid the effect of the threshold voltage of the driver transistor on its output current.

It should be understood that in the compensation phase t2, the fourth transistor T4 is turned on, and the source driver circuit provides a corresponding data signal to the sub-pixel through the data line, and during the process of turning on the fourth transistor T4, it is necessary to ensure that the data signal voltage Vdata output from the data signal terminal remains stable and unchanged to avoid the problem of display anomalies.

Figure 3:
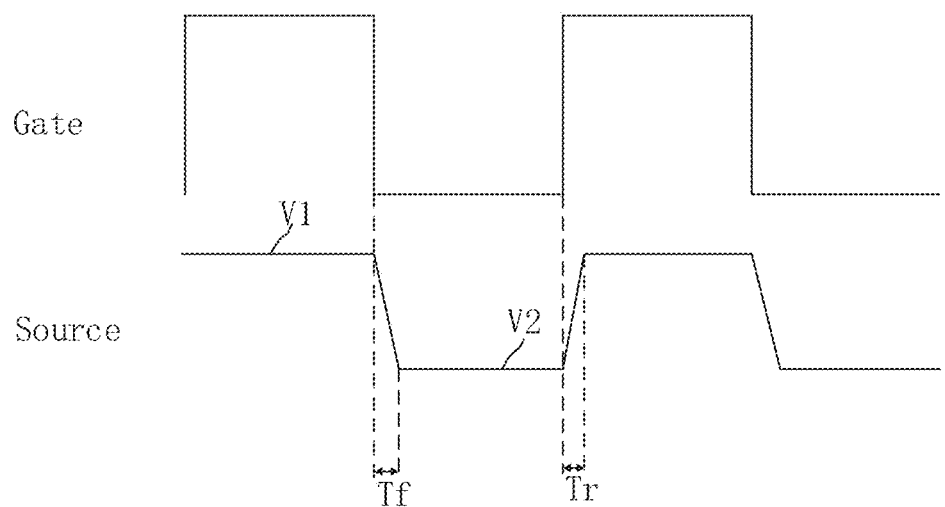
FIG. 3 is a schematic diagram of switching of data signals according to an embodiment of the present disclosure.

FIG. 3 is a schematic diagram of switching of data signals according to an embodiment of the present disclosure, in which a Gate signal represents a gate drive signal of the fourth transistor T4 in FIG. 1, a Source signal represents a data signal Da in FIG. 1, a first voltage value V1 is a data signal voltage corresponding to a first sub-pixel, and a second voltage value V2 is a data signal voltage corresponding to a second sub-pixel. As shown in FIG. 3, the data signal Da requires a failing time Tf and a rising time Tr (Source Settle time) to reach a stable state. Due to the effect of Tf and Tr, if the data signal Da is written to the fourth transistor T4 in FIG. 1 during the Tf and/or Tr, the data signal Da written may not be a complete signal, thereby affecting the display image quality and causing display problems.

In view of the above technical problems, in the present disclosure, two adjacent switching units are connected to sub-pixels having the same maximum grayscale value voltage in adjacent pixel units, so that when the two sub-pixels require the same brightness to be displayed, the source driver circuit S-IC can continuously output data signals Da with the same voltage value to provide the data signals Da for the two sub-pixels, and thus, a stable data signal Da can be acquired during the time when the fourth transistor T4 corresponding to each of the two sub-pixels is turned on, without the Tf and Tr in FIG. 3, and the display image quality can be improved. The solutions of the present disclosure are described in detail below in conjunction with the accompanying drawings.

Figure 4:
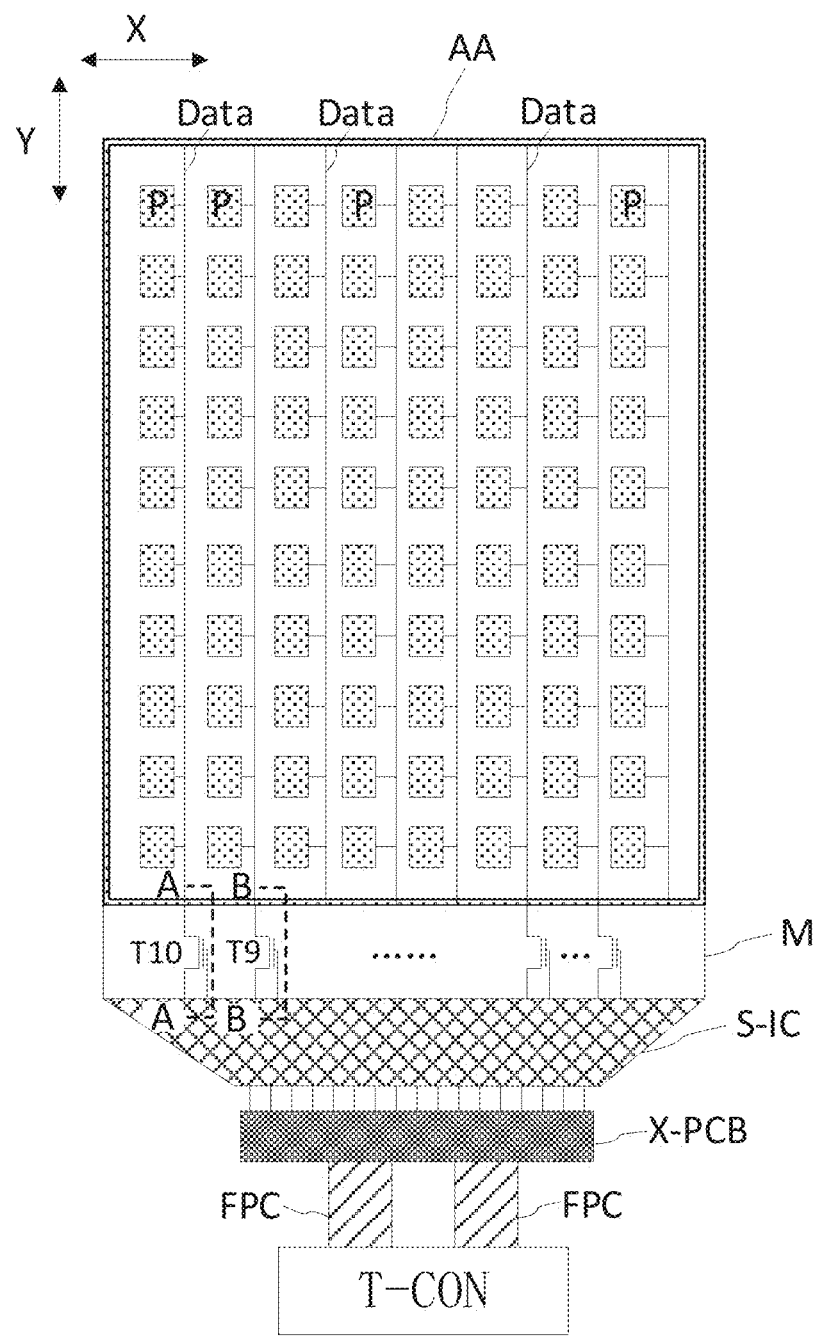
FIG. 4 is a schematic diagram of a structure of a display panel according to an embodiment of the present disclosure.
Figure 5:
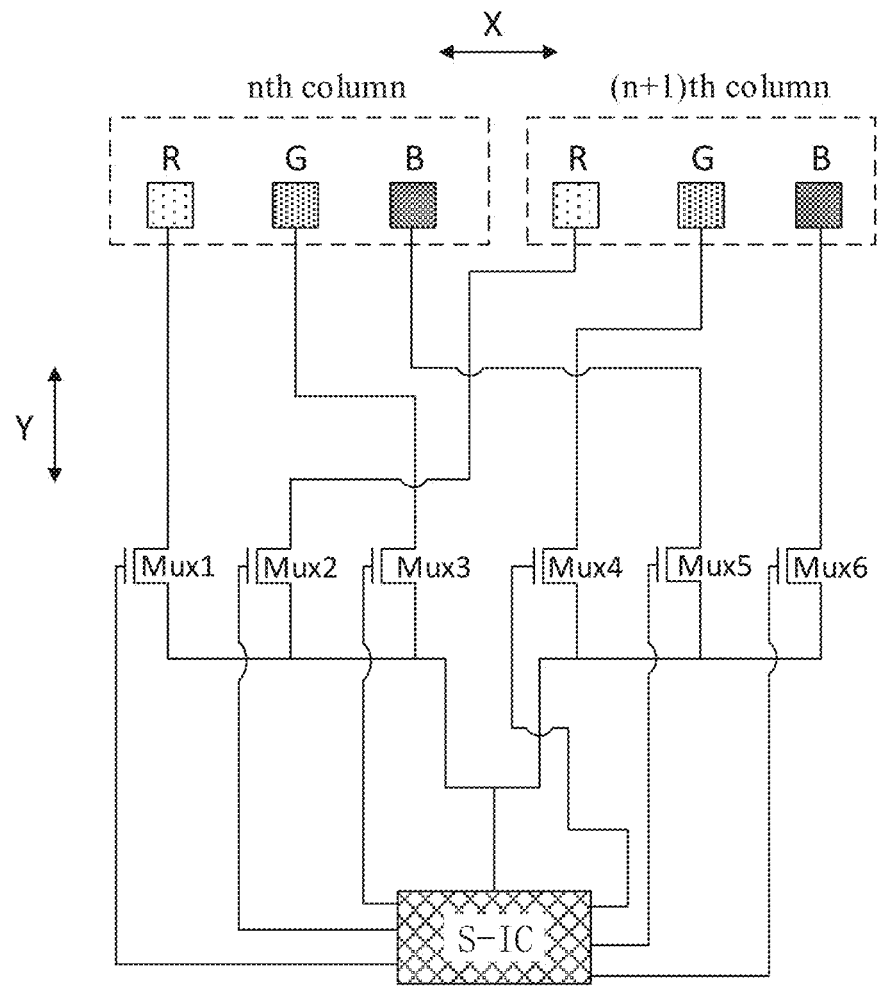
FIG. 5 is a schematic diagram of connections of some of switching units to pixel columns of FIG. 4.

FIG. 4 is a schematic diagram of a structure of a display panel according to an embodiment of the present disclosure, and FIG. 5 is a schematic diagram of connections of some of switching units to pixel columns of FIG. 4. As shown in FIGS. 4 and 5, the display panel may include a display area AA and a non-display area surrounding, or at least partially surrounding, the display area AA. The display area AA may include a plurality of pixel units distributed in an array along a row direction and a column direction. The pixel units include at least a first sub-pixel and a second sub-pixel, and a maximum grayscale value voltage of the first sub-pixel is less than a maximum grayscale value voltage of the second sub-pixel. The non-display area may include a source driver circuit S-IC and a switching circuit M. The source driver circuit S-IC may be configured to output a data signal Da and a switch control signal. The switching circuit M may include a plurality of switching units, where a control end of the switching unit is configured to receive the switch control signal, a first end of the switching unit is configured to receive the data signal Da, and a second end of the switching unit is connected to the data line Data. The first sub-pixel in any $n^{th}$ column of pixel units and the first sub-pixel in the $(n+1)^{th}$ column of pixel units are connected to two adjacent switching units through data lines, respectively, n being an odd number greater than or equal to 1.

The present disclosure provides the display panel which includes pixel units distributed in a multi-row and multi-column array. The pixel units include at least sub-pixels having different maximum grayscale value voltages. Each column of sub-pixels is connected to a switching unit through a data line Data and two sub-pixels having the same maximum grayscale value voltages in adjacent pixel units are connected to two adjacent switching units through the corresponding data lines Data. When the display panel is displayed in a non-color display or a part of the area of the display panel is displayed in a non-color display, the source driver circuit S-IC transmits and controls the data signals Da of the first sub-pixels of the pixel units in adjacent columns through two adjacent switching units without the need for switching of the data voltages, and the source driver circuit S-IC of the present disclosure can reduce the number of times of switching of the data signals Da with different voltage values as compared to a conventional circuit structure. In this way, the source driver circuit S-IC can output a data signal Da with a stable voltage to ensure the display image quality. The display panel of the present disclosure does not require the addition of new processes and masks, and is simple and easy to implement.

Generally, one pixel unit may include a first sub-pixel, a second sub-pixel, and a third sub-pixel, and the maximum grayscale value voltage of the first sub-pixel is different from the maximum grayscale value voltage of the second sub-pixel and the maximum grayscale value voltage of the third sub-pixel. The number of times of switching between different data signal voltages can be reduced by connecting the first sub-pixels in the adjacent pixel units to two adjacent switching units. In an embodiment, the first sub-pixel may be an R sub-pixel, the second sub-pixel may be a G sub-pixel, and the third sub-pixel may be a B sub-pixel, and the maximum grayscale value voltage of the R sub-pixel is different from the maximum grayscale value voltages of the G sub-pixel and B sub-pixel, and the maximum grayscale value voltages of the G sub-pixel and B sub-pixel are the same or close to the same. The maximum grayscale value voltage of the R sub-pixel may be, for example, 1V, and the maximum grayscale value voltage of the G sub-pixel and the B sub-pixel may be, for example, 6.2V.

The maximum grayscale value voltage described in the present disclosure can be understood as the voltage value of the data signal Da corresponding to the maximum grayscale value of the sub-pixel, i.e., the voltage value of the data signal Da when the grayscale value of the corresponding sub-pixel is 255.

Figure 6:
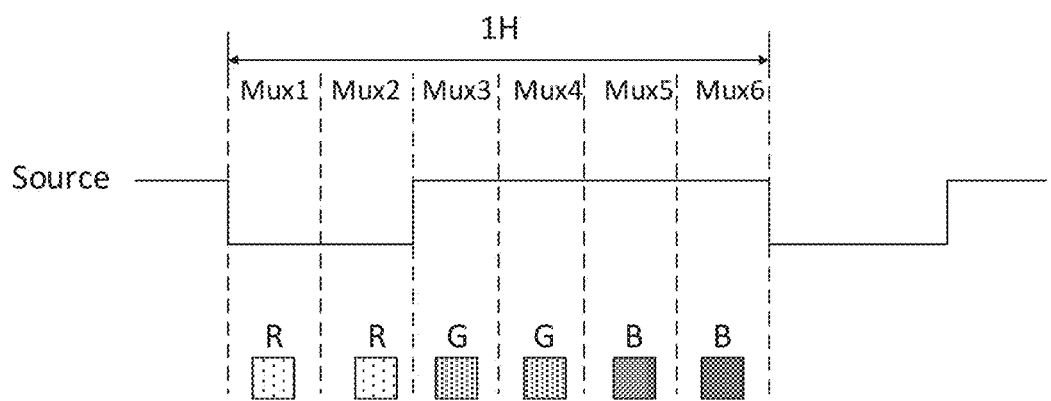
FIG. 6 is a timing diagram of each switching unit when each sub-pixel in FIG. 5 is at the maximum grayscale value voltage.

In the embodiment, FIG. 6 is a timing diagram of each switching unit when each sub-pixel in FIG. 5 is at the maximum grayscale value voltage, and, as shown in FIG. 6, for the $n^{th}$ column of pixel units and the $(n+1)^{th}$ column of pixel units, the R sub-pixel in the $n^{th}$ column of pixel units and the R sub-pixel in the $(n+1)^{th}$ column of pixel units can be connected to two adjacent switching units using the data lines Data, respectively, and the source driver circuit S-IC can control one switching unit to turn on in order to output the data signal Da to the R sub-pixel in the $n^{th}$ column of pixel units, and then control the other switching unit adjacent to said one switching unit to turn on in order to output the data signal Da to the R sub-pixel in the $(n+1)^{th}$ column of pixel units. When the data signal voltages of the R sub-pixels in the two columns of pixel units are the same as shown in FIG. 6, the source driver circuit S-IC outputs two data signals Da without level switching, i.e., when the data signals Da are output to the R sub-pixels in these two columns, there is no Tf and Tr as shown in FIG. 3, so that the R sub-pixels in these two columns can obtain stable data signals Da. It is apparent that this arrangement can improve the display image quality of the display panel and enhance the display effect.

In addition, since the number of times that the level switching is required for the data signal Da output by the source driver circuit S-IC during the time 1H is reduced, the processing frequency of the source driver circuit S-IC for the data is reduced, thereby reducing the power consumption of the source driver circuit S-IC as a whole, and contributing to the output of a data signal Da with a stabilized voltage from the source driver circuit S-IC to further ensure the display effect.

It should be understood that the display panel provided by the present disclosure is particularly applicable for displaying a non-color screen or displaying a non-color screen in at least a part of the display panel, where the data signal voltages of the same type of sub-pixels in adjacent pixel units are the same or the data signal voltages of the same type of sub-pixels in adjacent pixel units in at least a part of the area of the display panel are the same. For example, in a smart wearable product such as a smart bracelet, a smart watch, etc., the low power consumption screen in a Always On Display (AOD) mode displays normally at a pointer or dial position, and is black in other areas, and in the area shown in black, the data signal voltages of R sub-pixels in different pixel columns are the same, the data signal voltages of G sub-pixels in different pixel columns are the same, and the data signal voltages of B sub-pixels in different pixel columns are the same. Therefore, the structure of the display panel of the present disclosure can reduce the number of hops or transitions of the data signals Da in the black area, thereby further reducing the AOD power consumption of the smart wearable product. For another example, in the above-described smart wearable device or terminal product, the backgrounds of some APPs (e.g., the background of memo and the chat background of WeChat, etc.) are close to a pure white screen, most of the R sub-pixels have the same Source voltage, most of the G sub-pixels have the same Source voltage, and most of the B sub-pixels have the same Source voltage, and the smart wearable product or terminal product based on the display panel of the present disclosure can reduce the number of hops or transitions of the data signals, thereby not only reducing power consumption, but also reducing the influence of Tr and Tf during the transition of the data signals Da, which can improve the display image quality.

As shown in FIG. 4, in the embodiment, the source driver circuit S-IC (i.e., Source Driver Integrated Circuit, S-IC) is provided on a side of the display panel, and the source driver circuit S-IC is connected to a plurality of data lines Data to output data signals Da to sub-pixels in different columns through the plurality of data lines Data.

As shown in FIG. 4, in the embodiment, the display panel may further include a timing controller (T-CON). The timing controller may process the image data for each frame to generate a data signal Da and a control data that correspond to each frame of the image data. The control signal includes a switch control signal, which is used to control the switching unit in the non-display area on or off. The data signal Da is transmitted to the source driver circuit S-IC, and the source driver circuit S-IC converts the received data signal Da into a data voltage that is written to a corresponding sub-pixel in the display panel.

As shown in FIG. 4, in the embodiment, the timing controller T-CON may be connected to an X-Printed Circuit Board (X-PCB) through a Flexible Printed Circuit (FPC), and then connected to the source driver circuit S-IC through the X-PCB. The T-CON outputs its control signal to the source driver circuit S-IC through the X-PCB, and the T-CON can control the source driver circuit S-IC to input the data voltage to the data line Data.

As shown in FIG. 5, in the embodiment, the switching circuit M may include a plurality of switch selection circuits Mux. Each of the switches in the switch selection circuits Mux is a switching unit, and the switch selection circuit Mux may be, for example, a 1:6 MUX switch, a 1:9 MUX switch, and the like. A control end of the switching unit is connected to the source driver circuit S-IC to acquire the switch control signal output from the source driver circuit S-IC, a first end of the switching unit is connected to the source driver circuit S-IC to receive the data signal Da output from the source driver circuit S-IC, and a second end of the switching unit is connected to a corresponding sub-pixel through the data line Data to output the corresponding data signal Da to the connected sub-pixel. By using the switch selection circuits Mux to form the switching circuit M, the number of alignments between the source driver circuit S-IC and the display area AA can be reduced to save space.

As shown in FIG. 5, in the embodiment, a plurality of switching units are provided in one-to-one correspondence with a plurality of columns of sub-pixels, i.e., one switching unit controls the transmission of the data signal Da for one column of sub-pixels. Since the data signal voltages of the G sub-pixel and the B sub-pixel are the same or close to the same, the transmission of the data signals for the G sub-pixel and the B sub-pixel in the same pixel unit may be controlled using two switching units that are adjacent or are not adjacent to each other. For example, it may be as shown in FIG. 5 that the G sub-pixel in the $n^{th}$ column of pixel units is connected to the $(3n)^{th}$ switching unit, and the B sub-pixel in the $n^{th}$ column of pixel units is connected to the $(3n+2)^{th}$ switching unit, with n being an odd number greater than or equal to 1, i.e., the G sub-pixel and the B sub-pixel in the same pixel unit are connected to two switching units that are not adjacent to each other through the data lines Data, respectively. The advantage of this arrangement is that after the switching units are arranged in order, except for the switching units that need to be connected to the R sub-pixel columns in the adjacent pixel units, the other switching units can be connected to the data lines Data of respective columns of sub-pixels in the order of arrangement, and this wiring method can reduce the difficulty of controlling the timing signal.

Figure 7:
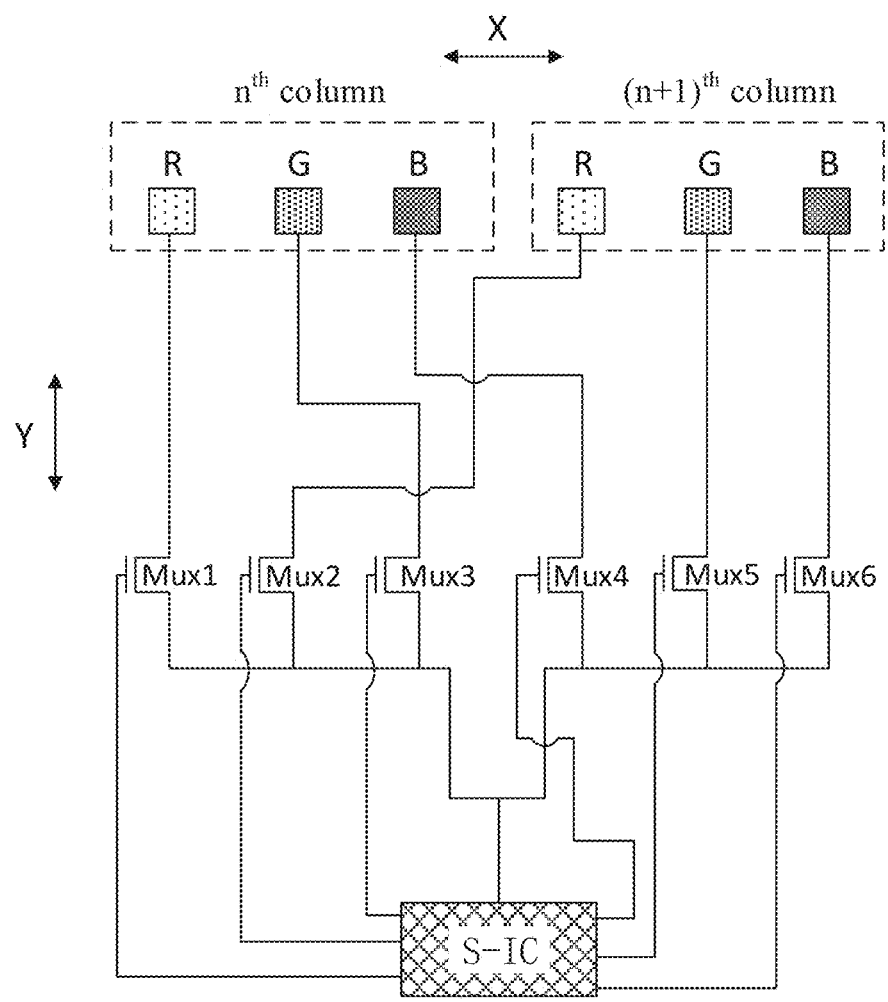
FIG. 7 is a schematic diagram of connections of some of the switching units to the pixel columns of FIG. 4 according to another embodiment of the present disclosure.

Of course, in other embodiments, it is also possible to use two adjacent switching units to connect the data lines Data of the G sub-pixel and the B sub-pixel in the same pixel unit. Exemplarily, FIG. 7 is a schematic diagram of connections of some of the switching units to the pixel columns in FIG. 4 according to another embodiment of the present disclosure. As shown in FIG. 7, the data line Data of the G sub-pixel of a pixel unit in the $(n+1)^{th}$ column is connected to the $(3n+2)^{th}$ switching unit, and the data line Data of the B sub-pixel of the pixel unit in the $(n+1)^{th}$ column is connected to the $(3n+3)^{th}$ switching unit; and the B sub-pixel of a pixel unit in the $n^{th}$ column is connected to the $(3n+1)^{th}$ switching unit, and the G sub-pixel of the pixel unit in the $n^{th}$ column is connected to the $(3n)^{th}$ switching unit, so as to realize that the data lines Data of the G sub-pixel and the B sub-pixel of the same pixel unit are connected to the adjacent switching units, n being an odd number greater than or equal to 1. Comparing FIG. 5, it can be seen that this connection method can further reduce the number of alignments to be overlapped, thereby simplifying the wiring difficulty.

It should be understood that the non-display area of the display panel usually includes other alignments, and therefore flexible wiring is required to synthesize the overall alignment of the non-display area, and under the condition that the data line Data of the R sub-pixel in the $n^{th}$ column of pixel units and the data line Data of the R sub-pixel in the $(n+1)^{th}$ column of pixel units are connected to two adjacent switching units, the flexible wiring is performed based on the principle of reducing the overall wiring difficulty, where n is an odd number greater than or equal to 1.

In the embodiment, the connection structure of the pixel unit and the switching unit shown in FIG. 5 may be repeated as a repeating unit or the connection structure shown in FIG. 6 may be repeated as a repeating unit. One repeating unit may for example include a first pixel unit and a second pixel unit adjacent to each other in the row direction, where the arrangement of sub-pixels in the first pixel unit and the arrangement of sub-pixels in the second pixel unit are the same and both the first pixel unit and the second pixel unit may include three types of sub-pixels, i.e., R, G, and B, and the one repeating unit may further include six switching units arranged sequentially in the row direction. As shown in FIGS. 5 and 6, within a repeating unit, the switching unit located in the first column is connected to the data line of the R sub-pixel in the first pixel unit, and the switching unit located in the second column is connected to the data line of the R sub-pixel in the second pixel unit, so that the display panel has the connection relationship between the switching units and the sub-pixel columns as described above in its entirety, which can improve the display image quality and reduce the overall power consumption of the source driver circuit S-IC.

In the embodiment, the switching unit may be implemented as a transistor, such as a thin-film transistor TFT. In other words, the switching circuit M described in the present disclosure may include a plurality of transistors, where a control end of the transistor receives the switch control signal output from the source driver circuit S-IC, a first end of the transistor receives the data signal Da output from the source driver circuit S-IC, and the second end of the transistor is connected to a corresponding column of sub-pixels through the data line Data.

In the embodiment, the switching circuit M may include a plurality of ninth transistors T9 and a plurality of tenth transistors T10, the ninth transistors T9 and the tenth transistors T10 being spaced apart in sequence. The $m^{th}$ column of sub-pixels and the $(m+1)^{th}$ column of sub-pixels are different sub-pixels in the $Z^{th}$ column of pixel units. The ninth transistor T9 corresponding to the $m^{th}$ column of sub-pixels is connected to the data line Data of the $m^{th}$ column of sub-pixels, and the tenth transistor T10 corresponding to the $(m+1)^{th}$ column of sub-pixels is connected to the data line Data corresponding to the sub-pixels in the $(Z+1)^{th}$ column of pixel units, where m is a positive integer greater than or equal to 1. In this case, a plurality of transistors in the switching circuit M are in one-to-one correspondence with the columns of sub-pixels, i.e., one ninth transistor T9 is connected to the data line Data of one column of sub-pixels, one tenth transistor T10 is connected to the data line Data of the next column of sub-pixels, and so on. The ninth transistor T9 and the data line Data connected thereto are connected by an alignment which is not overlapped with the alignments of the other transistors connecting the data line Data. The tenth transistor T10 and the data line Data connected thereto are connected by another alignment which is overlapped with the alignments of the other transistors connecting the data line Data. Therefore, there is a difference between the alignment of the ninth transistor T9 and the corresponding data line Data and the alignment of the tenth transistor T10 and the corresponding data line Data, and the alignment structures of the ninth transistor T9 and the tenth transistor T10 are further described below in conjunction with the accompanying drawings.

It should be understood that the non-display area and the display area AA of the display panel of the present disclosure may share the same film layer, i.e., the active layer of the non-display area and the active layer of the display area AA are the same film layer, the first conductive layer of the non-display area and the first conductive layer of the display area AA are the same film layer, the second conductive layer of the non-display area and the second conductive layer of the display area AA are the same film layer, and the third conductive layer of the non-display area and the third conductive layer of the display area AA are the same film layer. There may be the same insulating layer between the film layers.

Figure 8:
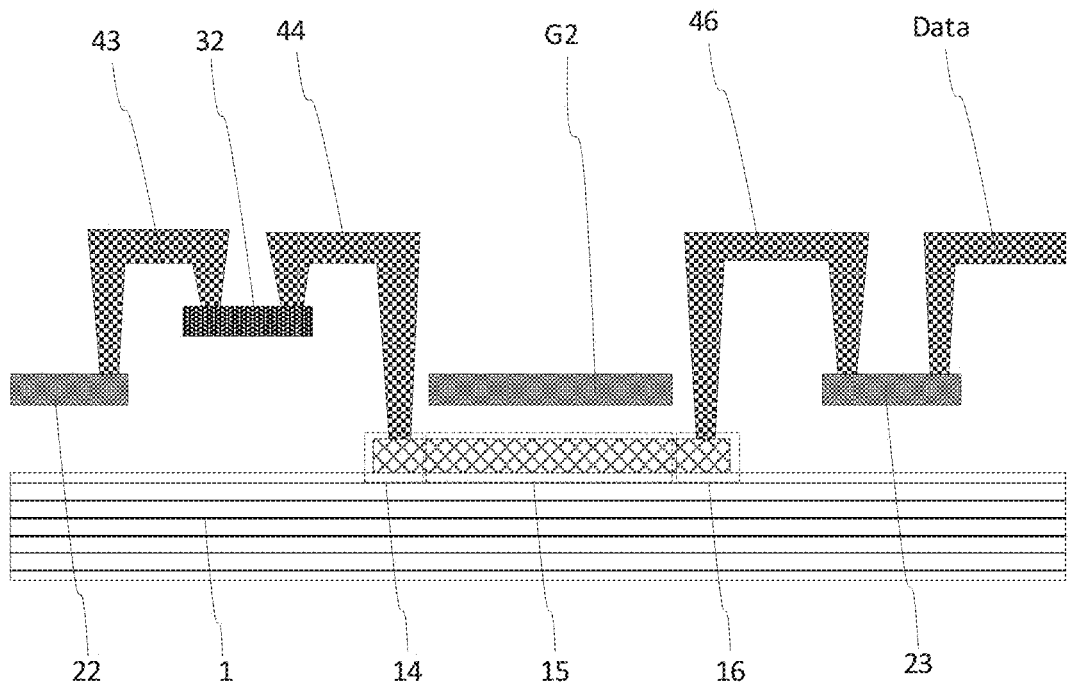
FIG. 8 is a sectional view corresponding to a position of a tenth transistor along a direction of a dashed line AA in FIG. 4.
Figure 9:
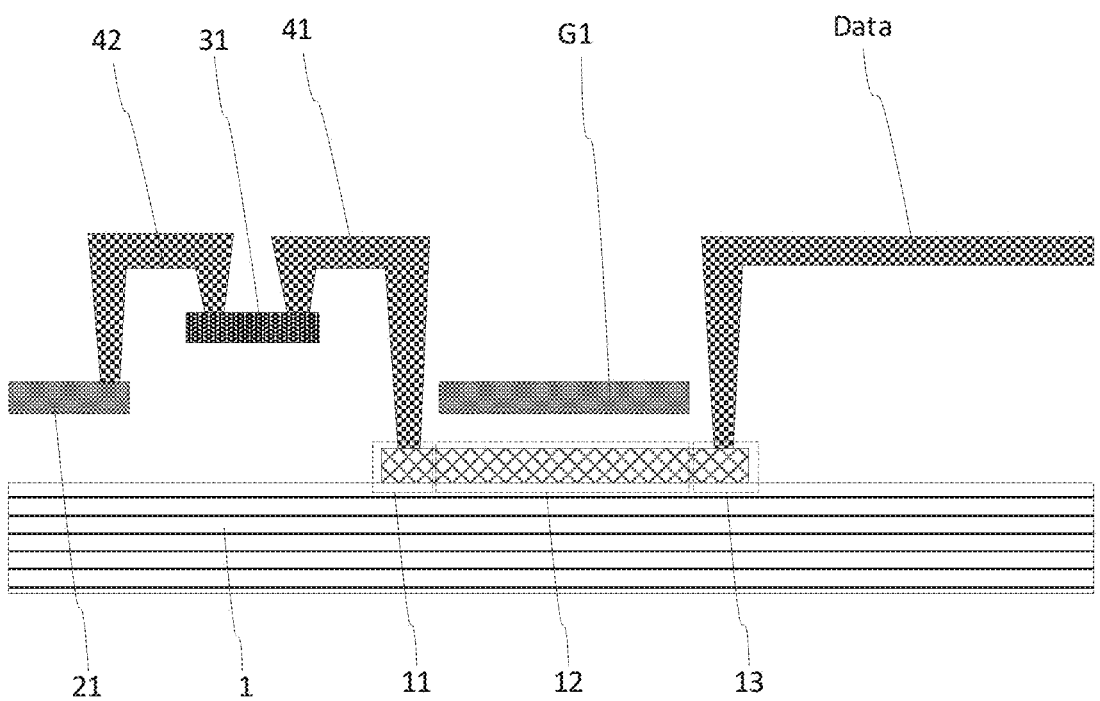
FIG. 9 is a sectional view corresponding to a position of a ninth transistor along a direction of a dashed line BB in FIG. 4.

FIG. 8 is a sectional view corresponding to a position of the tenth transistor along a direction of a dashed line AA in FIG. 4, and FIG. 9 is sectional view corresponding to a position of a ninth transistor along a direction of a dashed line BB in FIG. 4. As shown in FIGS. 8 and 9, in the embodiment, an active layer may include a plurality of second active portions 12 and a plurality of fifth active portions 15, where the second active portion 12 may be used to form a channel region of the ninth transistor T9 and the fifth active portion 15 may be used to form a channel region of the tenth transistor T10. The active layer may further include a plurality of first active portions 11, a plurality of third active portions 13, a plurality of fourth active portions 14, and a plurality of sixth active portions 16, where the first active portion 11 and the third active portion 13 are arranged in correspondence with the second active portion 12, and the first active portion 11 and the third active portion 13 are respectively connected to two ends of the second active portion 12 to form a first end and a second end of the ninth transistor T9, respectively. Similarly, the fourth active portion 14 and the sixth active portion 16 are arranged in correspondence with the fifth active portion 15, and the fourth active portion 14 and the sixth active portion 16 are respectively connected to two ends of the fifth active portion 15 to form a first end and a second end of the tenth transistor T10, respectively. The first active portion 11 may be connected to a first conductive line 41 of a third conductive layer through a via hole, and the first conductive line 41 is connected to a first connection line 21 of a first conductive layer through a first transfer portion 31 or directly through a via hole, so that the first end of the ninth transistor T9 is connected to the source driver circuit S-IC through the first connection line 21. Similarly, the fourth active portion 14 may be connected to a fourth conductive line 44 of the third conductive layer through a via hole, and the fourth conductive line 44 is connected to a second connection line 22 located in the first conductive layer through a second transfer portion 32 or directly through a via hole, so that the first end of the tenth transistor T10 is connected to the source driver circuit S-IC through the second connection line 22.

As shown in FIGS. 8 and 9, in the embodiment, the first conductive layer may be the Gate1 layer of the display area AA. The first conductive layer may include a plurality of first gate lines G1 and a plurality of second gate lines G2. Both the orthographic projection of the first gate line G1 on the base substrate 1 and the orthographic projection of the second gate line G2 on the base substrate 1 may extend in a first direction. The orthographic projection of the first gate line G1 on the base substrate 1 may cover the orthographic projection of the second active portion 12 on the base substrate 1, a portion of the structure of the first gate line G1 forms a gate of the ninth transistor T9, and the first gate line G1 may be connected to the source driver circuit S-IC to acquire a corresponding switch control signal. The orthographic projection of the second gate line G2 on the base substrate 1 may cover the orthographic projection of the fifth active portion 15 on the base substrate 1, a portion of the structure of the second gate line G2 forms a gate of the tenth transistor T10, and the second gate line G2 is also connected to the source driver circuit S-IC to acquire the switch control signal output from the source driver circuit S-IC.

The first conductive layer may also include a plurality of first connection lines 21. The orthographic projection of the first connection line 21 on the base substrate 10 may extend in a second direction, one end of the first connection line 21 may be connected to the source driver circuit S-IC to acquire the data signal Da output from the source driver circuit S-IC, and the other end of the first connection line 21 may be connected to the second conductive line 42 located in the third conductive layer through a via hole, so that the first end of the ninth transistor T9 is connected to the source driver circuit S-IC through the second conductive line 42, the first transfer portion 31 connected to the second conductive line 42, and the first conductive line 41 that is connected to the first active portion 11. Similarly, the first conductive layer may also include a plurality of second connection lines 22. The orthographic projection of the second connection line 22 on the base substrate 1 may extend in the second direction, one end of the second connection line 22 may be connected to the source driver circuit S-IC, and the other end may be connected to the third conductive line 43 located in the third conductive layer through a via hole, so that the first end of the tenth transistor T10 is connected to the source driver circuit S-IC through the third conductive line 43, the second transfer portion 32 connected to the third conductive line 43, and the fourth conductive line 44 that is connected to the fourth active portion.

As shown in FIGS. 8 and 9, in the embodiment, the first conductive layer may further include a transfer line 23. The transfer line 23 may be arranged in one-to-one correspondence with the sixth active portion 16. The orthographic projection of the transfer line 23 on the base substrate 1 may extend in the first direction, one end of the transfer line 23 may be connected to the sixth conductive line 46 of the third conductive layer through a via hole, and the other end may be connected to the data line Data of an adjacent pixel unit in the third conductive layer through a via hole, in order to connect the second end of the tenth transistor T10 to the data line Data of the corresponding sub-pixel in the adjacent pixel unit. That is, by providing the transfer line 23 in the first conductive layer, the second end of the tenth transistor T10 can be connected to the data line Data of the corresponding sub-pixel in the adjacent pixel unit, which can avoid other alignments of the third conductive layer that are connected to data lines Data of other sub-pixels. Moreover, by providing the transfer line 23 in the first conductive layer, the transfer line 23 is spaced farther away from the data line Data of the third conductive layer, and more insulating layers are spaced apart for electrical isolation, so that the parasitic capacitance between the transfer line 23 and the data line Data can be reduced, and the signal impact on the data line Data can be reduced to ensure the display effect. Of course, in other embodiments, the transfer line 23 may also be located in a second conductive layer, and the present disclosure is not limited thereto.

As shown in FIGS. 8 and 9, in the embodiment, the second conductive layer may be the Gate2 layer of the display area AA. The second conductive layer may include a first transfer portion 31 and a second transfer portion 32. The first transfer portion 31 is arranged in correspondence with the first connection line 21 of the first conductive layer 20, i.e., one first transfer portion 31 is correspondingly connected to one first connection line 21. The orthographic projection of the first transfer portion 31 on the base substrate 1 may be located between the orthographic projection of the first connection line 21 on the base substrate 1 and the orthographic projection of the first active portion 11 on the base substrate 1. Moreover, the first transfer portion 31 may be connected to the first conductive line 41 and the second conductive line 42 of the third conductive layer through via holes, respectively, so as to electrically connect the first conductive line 41 and the second conductive line 42 through the first transfer portion 31. Similarly, the second transfer portion 32 may be arranged in correspondence with the second connection line 22, i.e., one second connection line 22 is correspondingly connected to one second transfer portion 32. The orthographic projection of the second transfer portion 32 on the base substrate 1 may be located between the orthographic projection of the second connection line 22 on the base substrate 1 and the orthographic projection of the fourth active portion 14 on the substrate 1. Moreover, the second transfer portion 32 may be connected to the third conductive line 43 and the fourth conductive line 44 of the third conductive layer through via holes, respectively, so as to electrically connect the third conductive line 43 and the fourth conductive line 44 through the second transfer portion 32. It should be understood that in other embodiments, the first transfer portion 31 and the second transfer portion 32 may also be located in other conductive layers, for example, they may be located in the first conductive layer, i.e., the first conductive line 41 and the second conductive line 42 may also be transferred at the first conductive layer as well as the third conductive line 43 and the fourth conductive line 44 may also be transferred at the first conductive layer depending on whether other alignments exist at that location, and the present disclosure is not limited thereto.

As shown in FIGS. 8 and 9, the third conductive layer may be the SD layer of the display area AA. The third conductive layer may include a plurality of data lines Data. One data line Data is connected to a column of sub-pixels to provide a data signal Da to this column of sub-pixels. The third conductive layer may also include a first conductive line 41 and a second conductive line 42. The first conductive line 41 may be connected to the first active portion 11 and one end of the first transfer portion 31 through via holes, respectively. The second conductive line 42 may be connected to the other end of the first transfer portion 31 through a via hole and the first connection line 21 of the first conductive layer 20 through a via hole, respectively. In this way, the first end of the ninth transistor T9 is connected to the first connection line 21 and then to the source driver circuit S-IC, so as to acquire the data signal Da output from the source driver circuit S-IC.

The third conductive layer may also include a third conductive line 43 and a fourth conductive line 44. The fourth conductive line 44 may be connected to the fourth active portion 14 and one end of the second transfer portion 32 through via holes, respectively, and the third conductive line 43 may be connected to the other end of the second transfer portion 32 and the second connection line 22 through via holes, respectively, so as to connect the first end of the tenth transistor T10 to the second connection line 22 through the third conductive line 43 and the fourth conductive line 44 and thereby to the source driver circuit S-IC to acquire the data signal Da output from the source driver circuit S-IC.

The third conductive layer may also include a sixth conductive line 46. The sixth conductive line 46 is arranged in one-to-one correspondence with the sixth active portion 16, i.e., one sixth active portion 16 is connected to one sixth conductive line 46. The sixth conductive line 46 may be connected to the sixth active portion 16 and one end of the transfer line 23 through via holes, respectively, and the other end of the transfer line 23 extends to the corresponding data line Data and is connected to the data line Data at the corresponding location through a via hole, which realizes that the second end of the tenth transistor T10 is connected to the data line Data of the sub-pixel in an adjacent pixel unit through the sixth conductive line 46 and the transfer line 23.

Figure 10:
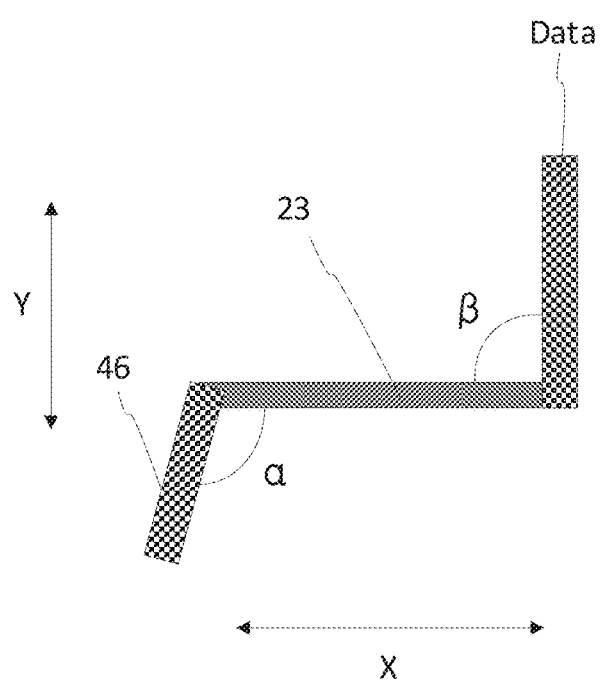
FIG. 10 is a schematic diagram of an orthographic projection of a transfer line overlapping an orthographic projection of a data line according to an embodiment of the present disclosure.

FIG. 10 is a schematic diagram of an orthographic projection of a transfer line overlapping an orthographic projection of a data line according to an embodiment of the present disclosure. As shown in FIG. 10, in the embodiment, the angle α between the orthographic projection of the transfer line 23 on the base substrate 1 and the orthographic projection of the sixth conductive line 46 connected to the transfer line 23 on the base substrate 1 is greater than or equal to 60° and less than or equal to 120°, which may be, for example, 60°, 70°, 80°, 90°, 100°, 110°, 120°, etc. The orthographic projection of the transfer line 23 on the base substrate 1 intersects the orthographic projection of the data line Data on the base substrate 1 to form an angle β greater than or equal to 60° and less than or equal to 120°, which may be, for example, 60°, 70°, 80°, 90°, 100°, 110°, 120°, and the like. By setting the angle between the orthographic projection of the transfer line 23 on the base substrate 1 and the orthographic projection of the data line Data on the base substrate 1 to be within the above angle range, the overlapping area of the transfer line and the data line can be reduced, which is conducive to further reducing the parasitic capacitance generated between the transfer line 23 and the data line Data, and reducing the impact on the data signal Da on the data line Data. In addition, it should be understood that the angle α and the angle β may be the same or different. In a preferred embodiment of the present disclosure, both of the above mentioned angles α and β may be set to 90°, i.e., the orthographic projection of the transfer line 23 on the base substrate 1 intersects perpendicularly with the orthographic projection of the data line on the base substrate 1, and the orthographic projection of the transfer line 23 on the base substrate 1 intersects perpendicularly with the orthographic projection of the sixth conductive line 46 on the base substrate 1, which can minimize the overlapping area, and accordingly, can minimize the parasitic capacitance between the transfer line 23 and the data line Data.

The present disclosure also provides a method of preparing a display panel, which can be used to form the display panel having the structure shown in FIG. 8. As shown in FIGS. 11 to 20b, they are process flow diagrams of a method for preparing a display panel according to an embodiment of the present disclosure. The method may include the following steps.

Figure 11:
FIGS. 11 to 20b are process flow diagrams of a method for preparing a display panel according to an embodiment of the present disclosure.

S10, providing a base substrate 1. The base substrate 1 includes a display area AA and a non-display area at least partially surrounding the display area AA. As shown in FIG. 11, the base substrate 1 may be transparent glass, or quartz glass, etc., and in the case where the display panel is a flexible display panel, the base substrate 1 may also be a flexible substrate made of an organic material such as polyimide (short for PI).

In some embodiments, a buffer material may also be deposited using a Plasma Enhanced Chemical Vapor Deposition (PECVD) process to form a buffer layer covering the base substrate 1. The buffer material may, for example, be at least one of silicon nitride, silicon oxide, or silicon nitride oxide, where the buffer layer may be a single-layer structure or a multi-layer structure. In the case where the buffer layer is a multi-layer structure, the buffer materials of the different layers may be the same or different.

Figure 12A:
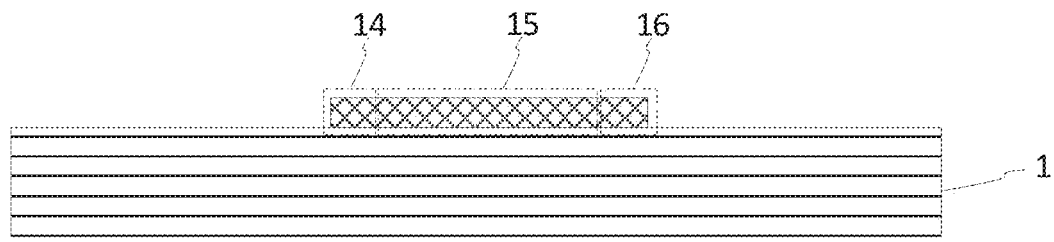

S20, forming an active layer in the non-display area on a side of the base substrate 1. As shown in FIG. 12a, a semiconductor material may be deposited on the base substrate 1 using a sputter process to form the active layer. The semiconductor material may be, for example, polysilicon material, and accordingly, the ninth transistor T9 and the tenth transistor T10 formed may be P-type low-temperature polysilicon thin-film transistors.

In the embodiment, a plurality of fifth active portions 15, a plurality of sixth active portions 16, and a plurality of fourth active portions 14 may be produced by exposing, developing, and etching the active layer, where the fifth active portion 15 is used to form a channel region of the tenth transistor T10, and the fourth active portion 14 and the sixth active portion 16 are connected to two sides of the fifth active portion 15, respectively, to form a first end and a second end for the tenth transistor T10.

Figure 12B:
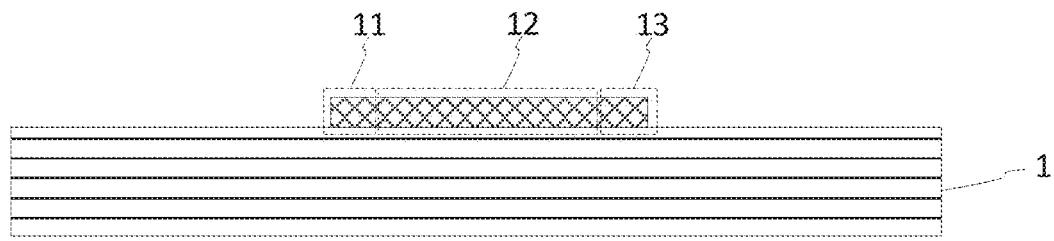

In the embodiment, as shown in FIG. 12b, the active layer may further include a plurality of first active portions 11, a plurality of second active portions 12, and a plurality of third active portions 13, where the second active portion 12 is used to form a channel region of the ninth transistor T9, and the first active portion 11 and the third active portion 13 are located on both sides of the second active portion 12, respectively, to form a first end and a second end for the ninth transistor T9.

Figure 13A:
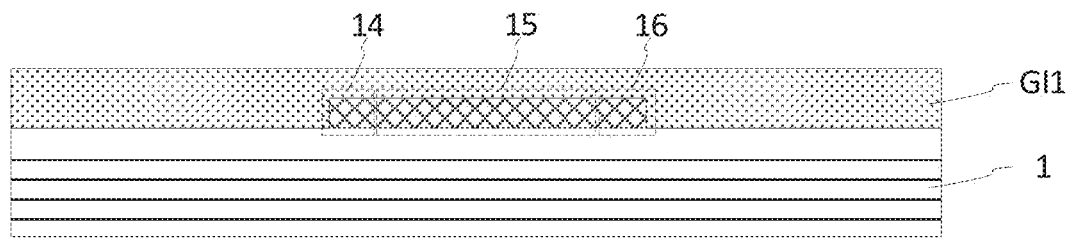
Figure 13B:
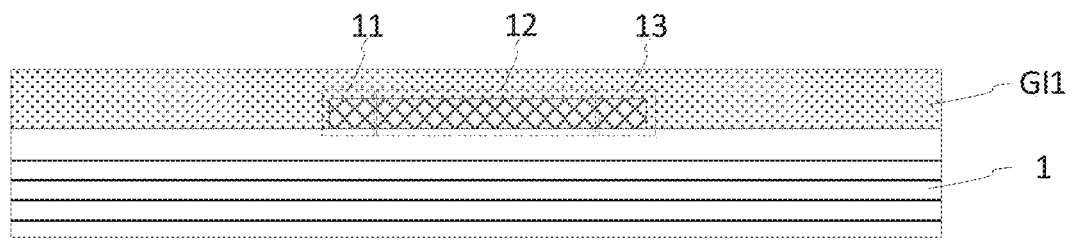

In the embodiment, as shown in FIGS. 13a and 13b, after forming the active layer, a first inorganic material may be deposited utilizing a PECVD process to form a first gate insulating layer GI1. The first inorganic material may be, for example, SiO2.

S30, forming a first conductive layer on a side of the active layer away from the base substrate 1.

Figure 14A:
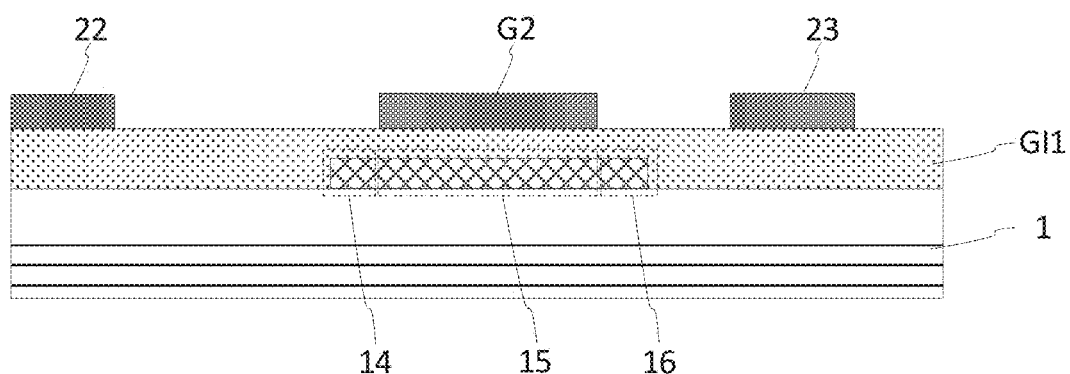

In the embodiment, as shown in FIG. 14a, the first conductive material may be, for example, molybdenum (Mo). The first conductive layer may be deposited using a Sputter device to cover the first gate insulating layer GI1, and an etching process may be performed on the first conductive layer to obtain a plurality of second gate lines G2 and a plurality of transfer lines 23. The orthographic projection of the second gate line G2 on the base substrate 1 may extend along a first direction and may cover the orthographic projection of the fifth active portion 15 on the base substrate 1, and a portion of the structure of the second gate line G2 is used to form a gate of the tenth transistor T10. The orthographic projection of the transfer line 23 on the base substrate 10 may extend along the first direction, and the transfer line 23 may be connected to the sixth conductive line 46 and the corresponding data line Data in the adjacent pixel unit through via holes, respectively, in order to connect the second end of the tenth transistor T10 to the data line Data of the corresponding sub-pixel in the adjacent pixel unit by transferring at the first conductive layer through the transfer line 23.

In the embodiment, as shown in FIG. 14a, a plurality of second connection lines 22 may also be formed by etching on the first conductive layer. The orthographic projection of the second connection line 22 on the base substrate 1 may extend in a second direction, and the second connection line 22 and the transfer line 23 are located on two sides of the second gate line G2, so as to connect the first end of the tenth transistor T10 to the source driver circuit S-IC through the second connection line 22.

Figure 14B:
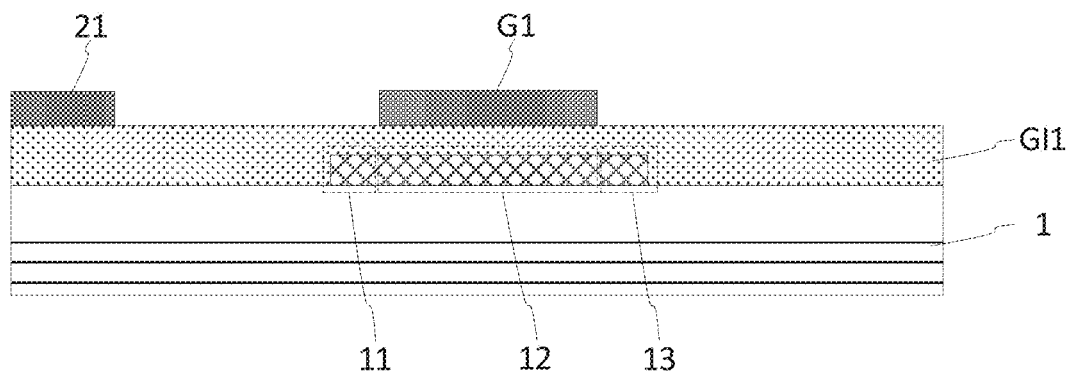

In the embodiment, as shown in FIG. 14b, a plurality of first gate lines G1 and a plurality of first connection lines 21 may also be formed by etching on the first conductive layer. The orthographic projection of the first gate line G1 on the base substrate 1 may extend in the first direction and may cover the orthographic projection of the second active portion 12 on the base substrate 1, and a portion of the structure of the first gate line G1 is used to form the gate of the ninth transistor T9. The orthographic projection of the first connection line 21 on the base substrate 1 may extend in the second direction, and the first connection line 21 is connected to the source driver circuit S-IC, so as to connect the first end of the ninth transistor T9 to the source driver circuit S-IC through the first connection line 21.

Figure 15A:
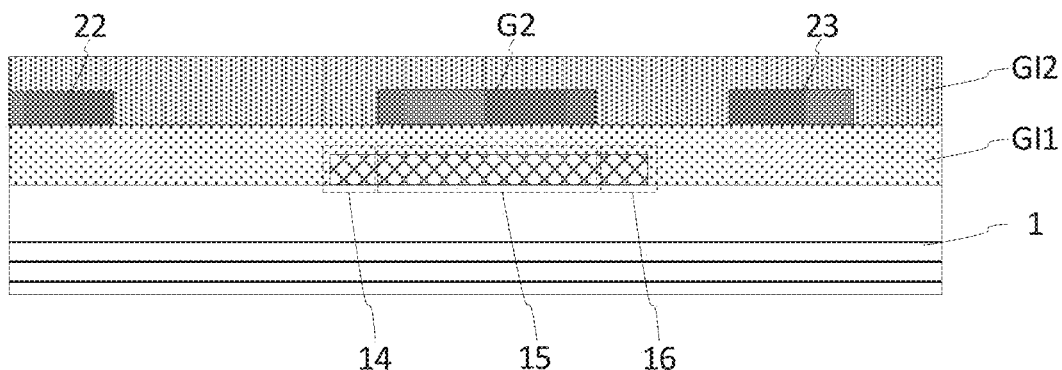
Figure 15B:
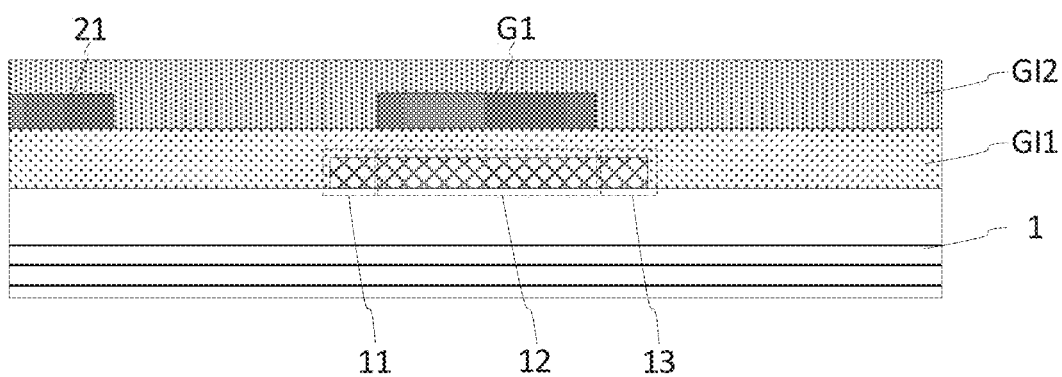

In the embodiment, as shown in FIGS. 15a and 15b, after forming the first conductive layer, a second gate insulating layer GI2 may also be formed by depositing a second inorganic material utilizing a PECVD process. The second inorganic material may be, for example, silicon nitride (SiNx).

Figure 16A:
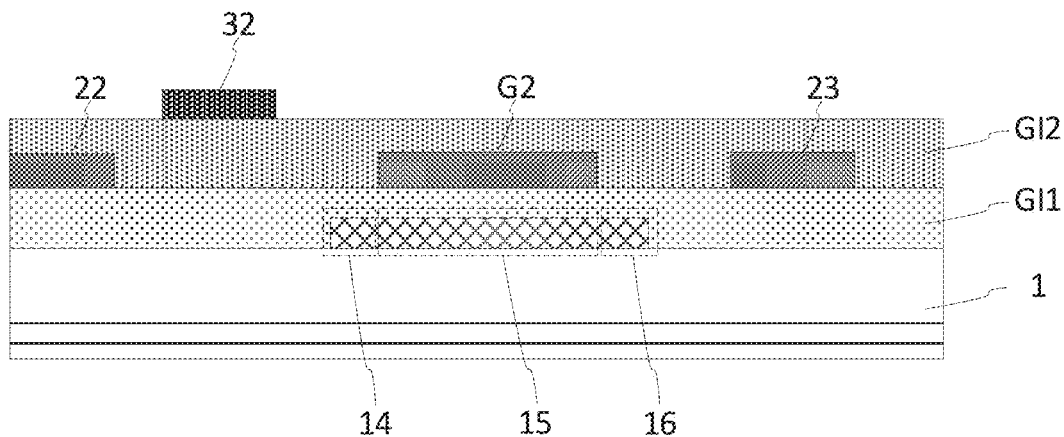
Figure 16B:
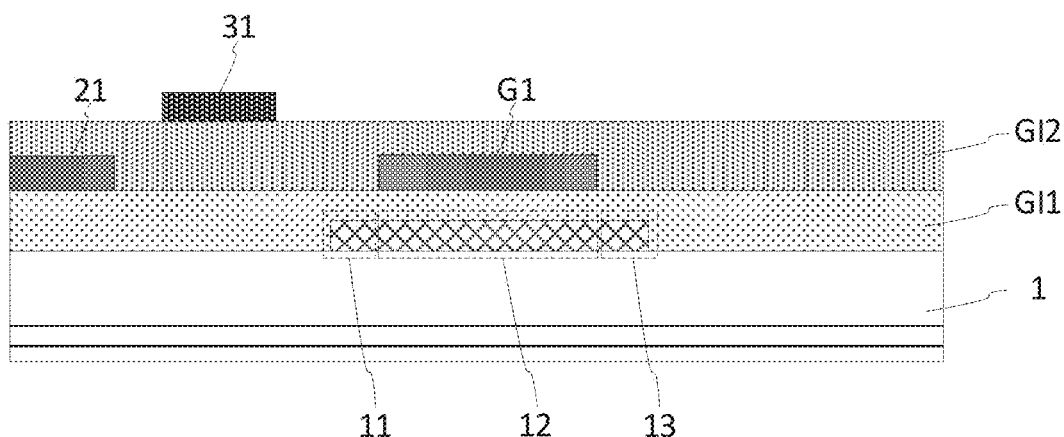

In the embodiment, as shown in FIGS. 16a and 16b, a second conductive layer may also be deposited using a Sputter device to cover the second gate insulating layer GI2. The material of the second conductive layer may be, for example, Mo. The second conductive layer may then be formed into a plurality of second transfer portions 32 and a plurality of first transfer portions 31 using an etching process. The orthographic projection of the second transfer portion 32 on the base substrate 1 may be located between the orthographic projection of the fourth active portion 14 on the base substrate 1 and the orthographic projection of the second connection line 22 on the base substrate 1, and the second transfer portion 32 may be connected to the third conductive line 43 and the fourth conductive line 44 through via holes, respectively. The orthographic projection of the first transfer portion 31 on the base substrate 1 may be located between the orthographic projection of the first active portion 11 in the base substrate 1 and the orthographic projection of the first connection line 21 on the base substrate 1, and the first transfer portion 31 may be connected to the first conductive line 41 and the second conductive line 42 through via holes, respectively.

Figure 17A:
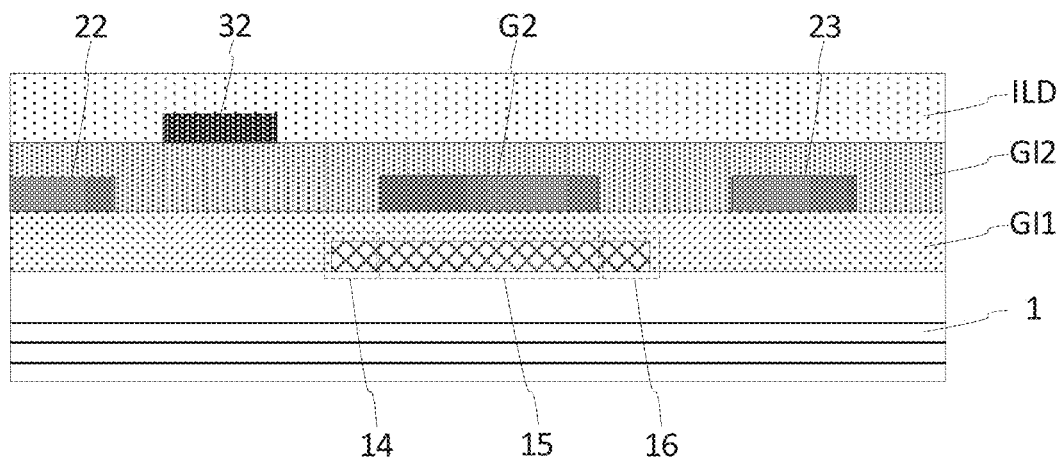
Figure 17B:
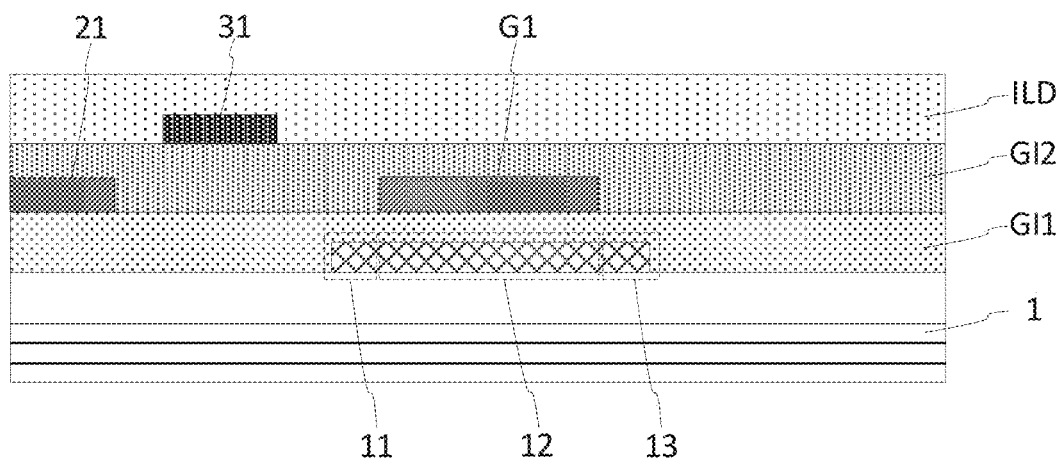
Figure 18A:
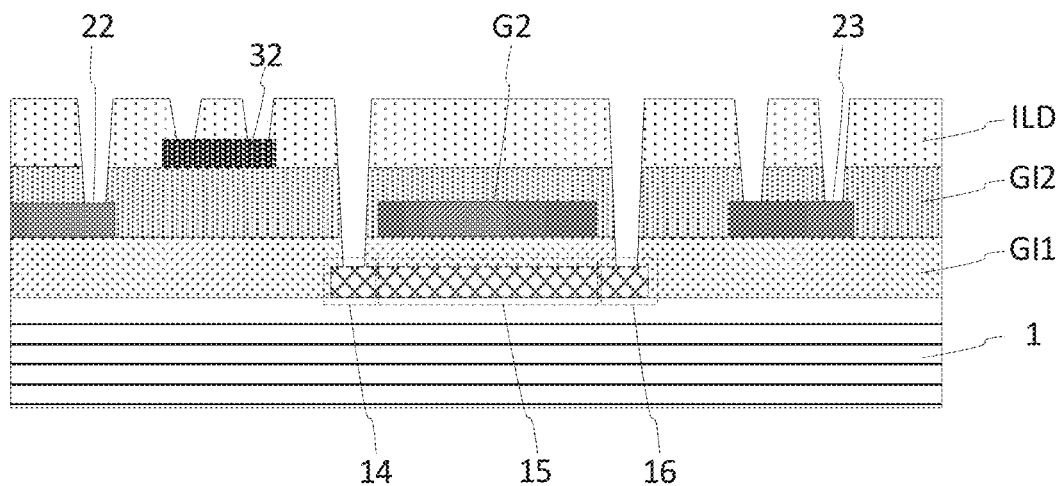
Figure 18B:
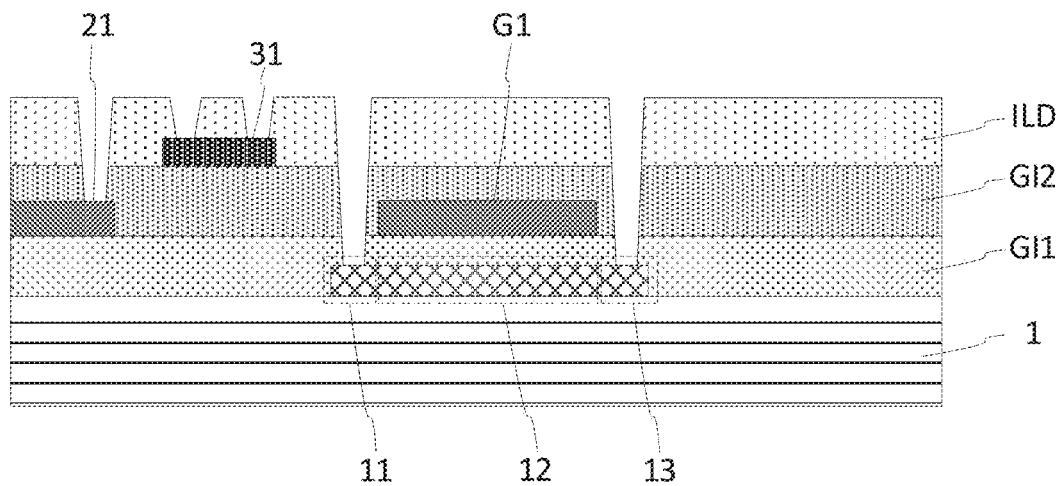

In the embodiment, as shown in FIGS. 17a and 17b, after forming the second conductive layer, an interlayer dielectric layer ILD may also be formed by depositing the first inorganic material or the second inorganic material using a PECVD process, and then a plurality of via holes may be formed in the interlayer dielectric layer using a dry etching process, as shown in FIGS. 18a and 18b.

Figure 19A:
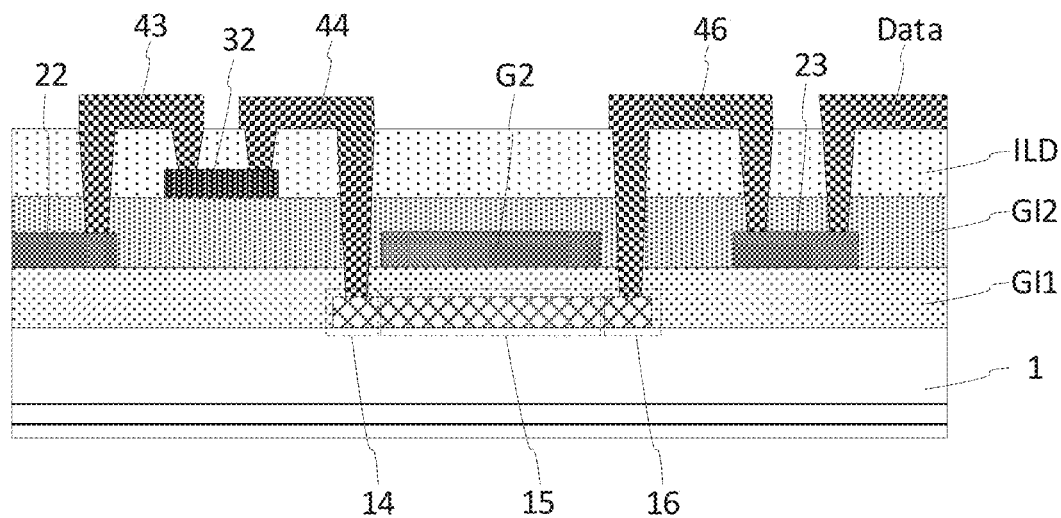

S40, forming a third conductive layer by depositing the second conductive material on a side of the first conductive layer away from the base substrate 1 using a deposition process. As shown in FIG. 19a, a Sputter device may be used to deposit the second conductive material to form the third conductive layer, and then the third conductive layer is formed into a plurality of data lines Data and a plurality of sixth conductive lines 46 using an etching process. The orthographic projection of the data line Data on the base substrate 1 may extend in the second direction, and one data line Data is connected to one column of sub-pixels. The sixth conductive line 46 is arranged correspondingly with the sixth active portion 16, the orthographic projection of the sixth conductive line 46 on the base substrate 1 may extend along the second direction, and the sixth conductive line 46 is connected to the sixth active portion 16 through a via hole.

In the embodiment, as shown in FIG. 19a, a plurality of fourth conductive lines 44 and a plurality of third conductive lines 43 may also be formed in the third conductive layer using an etching process. The fourth conductive line 44 is connected to the fourth active portion 14 and the second transfer portion 32 through via holes, and the third conductive line 43 is connected to the second transfer portion 32 and the second connection line 22 through via holes, so as to connect the first end of the tenth transistor T10 to the source driver circuit S-IC through the third conductive line 43, the second transfer portion 32, the fourth conductive line 44, and the second connection line 22.

Figure 19B:
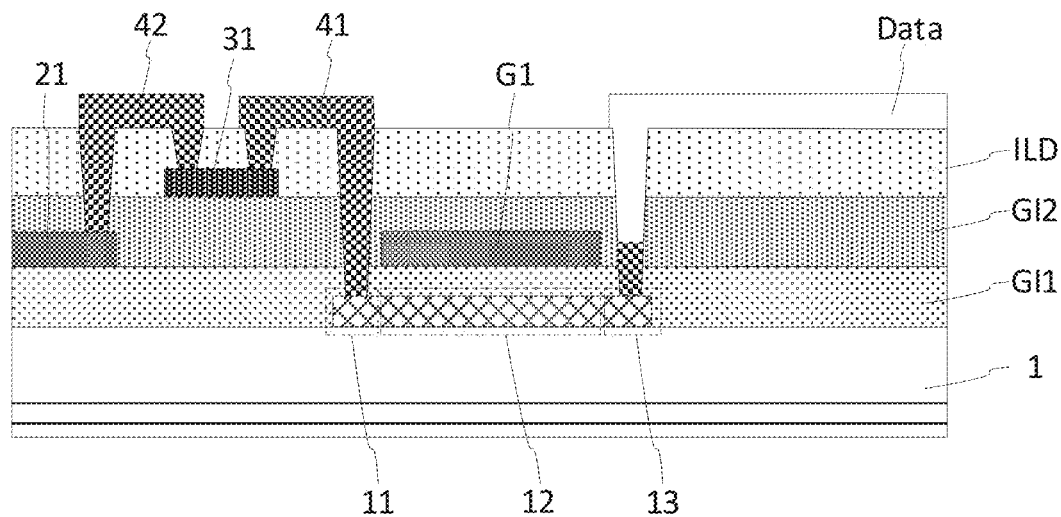

In the embodiment, as shown in FIG. 19b, a plurality of first conductive lines 41 and a plurality of second conductive lines 42 may also be formed in the third conductive layer using an etching process. The first conductive line 41 is connected to the first active portion 11 and the first transfer portion 31 through via holes, and the second conductive line 42 is connected to the first transfer portion 31 and the first connection line 21 through via holes, so as to connect the first end of the ninth transistor T9 to the source driver circuit S-IC through the first conductive line 41, the first transfer portion 31, the second conductive line 42, and the first connection line 21.

Figure 20A:
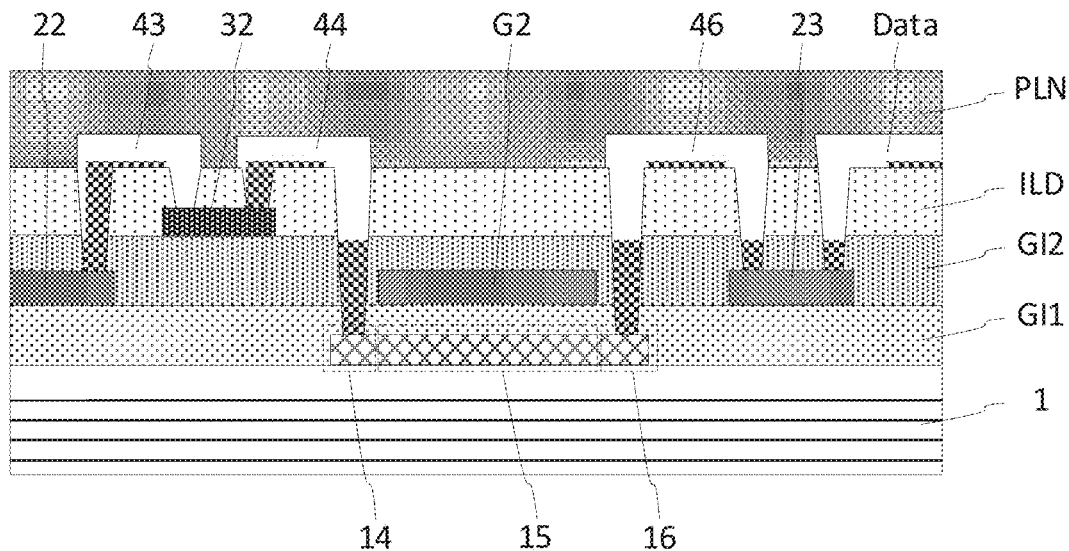
Figure 20B:
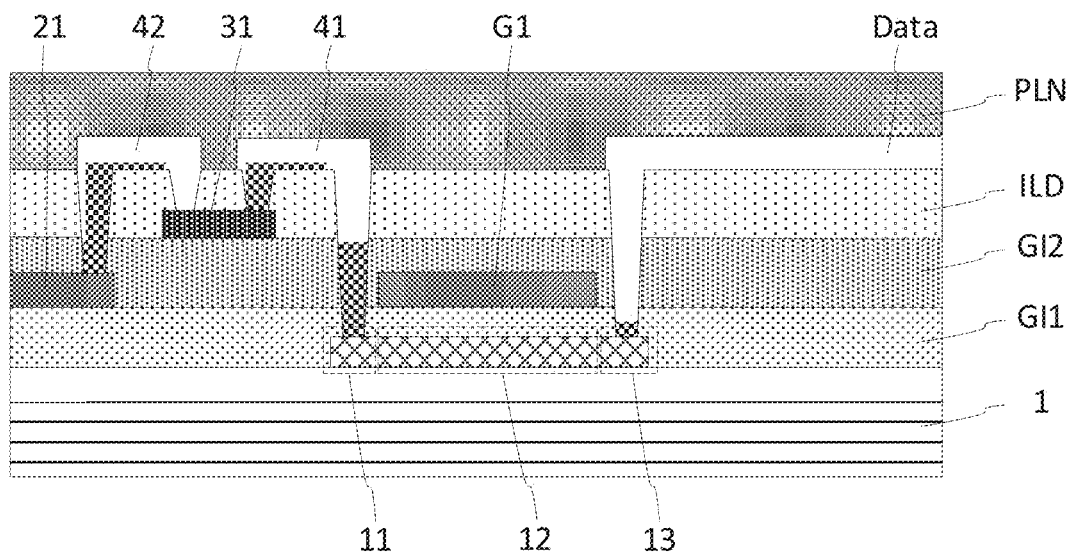

In the embodiment, as shown in FIGS. 20a and 20b, after forming the third conductive layer, a planarization layer may also be formed using a coating process and a curing process.

The present disclosure also provides a display device including a display panel as described in any of the above embodiments. The display device may be a display device such as a cell phone, a tablet computer, a smart watch, and the like.

Those skilled in the art, after considering the specification and practicing the invention disclosed herein, will readily conceive of other embodiments of the present disclosure. This application is intended to cover any variations, uses, or adaptations of the present disclosure that follow the general principles of the present disclosure and that include common knowledge or customary technical means in the technical field that are not disclosed herein. The specification and embodiments are to be considered exemplary only, and the true scope and spirit of the disclosure is indicated by the appended claims.

What is claimed is:

1. A display panel, comprising:
 a display area comprising a plurality of pixel units distributed in an array, wherein the plurality of pixel units comprise at least a first sub-pixel and a second sub-pixel, and a maximum grayscale value voltage of the first sub-pixel is less than a maximum grayscale value voltage of the second sub-pixel;
 a source driver circuit on a side of the display area, wherein the source driver circuit is configured to output a data signal and a switch control signal; and
 a switching circuit on a side of the display area, wherein the switching circuit comprises a plurality of switching units, a control end of the switching unit is configured to receive the switch control signal, a first end of the switching unit is configured to receive the data signal, and a second end of the switching unit is connected to a data line;
 wherein the first sub-pixel in a $n^{th}$ column of pixel units and the first sub-pixel in a $(n+1)^{th}$ column of pixel units are connected to two adjacent switching units through data lines, respectively, n being an odd number greater than or equal to 1.

2. The display panel of claim 1, wherein the plurality of pixel units further comprise a third sub-pixel, and wherein the second sub-pixel and the third sub-pixel in a same pixel unit are connected to two adjacent switching units or two switching units spaced apart through data lines, respectively.

3. The display panel of claim 1, wherein the plurality of switching units are arranged in correspondence with a plurality of columns of sub-pixels.

4. The display panel of claim 3, comprising a plurality of repeating units distributed along a row direction, wherein the repeating unit comprises a first pixel unit and a second pixel unit adjacent to each other in the row direction and six switching units of the plurality of switching units sequentially arranged in the row direction; and
 wherein in the repeating unit, the switching unit in a first column is connected to the data line of the first sub-pixel in the first pixel unit, and the switching unit in a second column is connected to the data line of the first sub-pixel in the second pixel unit.

5. The display panel of claim 1, wherein the first sub-pixel is an R sub-pixel.

6. The display panel of claim 4, wherein the switching unit is a transistor.

7. The display panel of claim 6, wherein the switching circuit comprises a plurality of ninth transistors and a plurality of tenth transistors, the plurality of ninth transistors and the plurality of tenth transistors being spaced apart in sequence; and
 wherein a sub-pixel of a $m^{th}$ column and a sub-pixel of a $(m+1)^{th}$ column are different sub-pixels in a pixel unit of a $Z^{th}$ column, the ninth transistor corresponding to the sub-pixel of the $m^{th}$ column is connected to a data line of the sub-pixel of the $m^{th}$ column, and the tenth transistor corresponding to the sub-pixel of the $(m+1)^{th}$ column is connected to a data line of a corresponding sub-pixel in a pixel unit of a $(Z+1)^{th}$ column, m and Z being a positive integer greater than or equal to 1.

8. The display panel of claim 7, wherein the tenth transistor is connected to the data line of the corresponding sub-pixel in the pixel unit of the $(Z+1)^{th}$ column through a transfer line, and wherein the transfer line and the data line are in different conductive layers.

9. The display panel of claim 8, further comprising:
 a base substrate comprising the display area;
 an active layer on a side of the base substrate, the active layer comprising:
  a plurality of fifth active portions, wherein the fifth active portion is configured to form a channel region for the tenth transistor; and
  a plurality of sixth active portions, wherein the sixth active portion is connected to a side of the fifth active portion;
 a first conductive layer on a side, away from the base substrate, of the active layer, wherein the first conductive layer comprises:
  a plurality of second gate lines, wherein an orthographic projection of the second gate line on the base substrate covers an orthographic projection of the fifth active portion on the base substrate, and a portion of the second gate line is configured to form a gate of the tenth transistor; and
 a third conductive layer on a side, away from the base substrate, of the first conductive layer, wherein the third conductive layer comprises:
  a plurality of data lines, wherein one of the plurality of data lines is connected to one column of sub-pixels; and
  a plurality of sixth conductive lines arranged in correspondence with the plurality of sixth active portions, the sixth conductive line being connected to the sixth active portion through a via hole;
 wherein the transfer line is connected to the sixth conductive line and a corresponding data line in an adjacent pixel unit through via holes, respectively.

10. The display panel of claim 9, wherein the transfer line is in the first conductive layer.

11. The display panel of claim 9, wherein an angle, between an orthographic projection of the transfer line on the base substrate and an orthographic projection of the sixth conductive line connected to the transfer line on the base substrate, is greater than or equal to 60° and less than or equal to 120°; and an angle formed by the orthographic projection of the transfer line on the base substrate intersecting an orthographic projection of the data line on the base substrate, is greater than or equal to 60° and less than or equal to 120°.

12. The display panel of claim 9,
wherein the active layer further comprises a plurality of fourth active portions, wherein the fourth active portion is connected to a side, away from the sixth active portion, of the fifth active portion;
wherein the first conductive layer further comprises a plurality of second connection lines, the second connection line being connected to the source driver circuit;
wherein the third conductive layer further comprises:
 a plurality of fourth conductive lines arranged in correspondence with the plurality of fourth active portions, wherein the fourth conductive line is connected to the corresponding fourth active portion through a via hole; and
 a plurality of third conductive lines arranged in correspondence with the plurality of second connection lines, wherein the third conductive line is connected to the corresponding second connection line through a via hole; and
wherein the display panel further comprises a second conductive layer between the first conductive layer and the third conductive layer, wherein the second conductive layer comprises:
 a plurality of second transfer portions arranged in correspondence with the plurality of fifth active portions, wherein an orthographic projection of the second transfer portion on the base substrate is between an orthographic projection of the fourth active portion on the base substrate and an orthographic projection of the second connection line on the base substrate, and the second transfer portion is connected to the corresponding third conductive line and the corresponding fourth conductive line through via holes, respectively.

13. The display panel of claim 9,
wherein the active layer further comprises:
 a plurality of second active portions, wherein an orthographic projection of the second active portion on the base substrate is in an non-display area, and the second active portion is configured to form a channel region for the ninth transistor;
 a plurality of first active portions arranged in correspondence with the plurality of second active portions, wherein the first active portion is connected to a side of the second active portion; and
 a plurality of third active portions arranged in correspondence with the plurality of second active portions, wherein the third active portion is connected to a side, away from the first active portion, of the second active portion, and wherein the second active portion is connected to a corresponding data line through a via hole;
wherein the first conductive layer further comprises:
 a plurality of first gate lines, wherein an orthographic projection of the first gate line on the base substrate covers the orthographic projection of the second active portion on the base substrate, and a portion of the first gate line is configured to form a gate of the ninth transistor; and
 a plurality of first connection lines, the first connection line being connected to the source driver circuit;
wherein the second conductive layer further comprises:
 a plurality of first transfer portions arranged in correspondence with the plurality of second active portions, wherein an orthographic projection of the first transfer portion on the base substrate is between an orthographic projection of the first active portion on the base substrate and an orthographic projection of the first connection line on the base substrate; and
wherein the third conductive layer further comprises:
 a plurality of first conductive lines, wherein the first conductive line is connected to the corresponding first active portion and the corresponding first transfer portion through via holes; and
 a plurality of second conductive lines, wherein the second conductive line is connected to the corresponding first connection line and the corresponding first transfer portion through via holes.

14. The display panel of claim 1, wherein the switching circuit comprises a plurality of switch selection circuits, and wherein the plurality of switch selection circuits comprise the plurality of switching units.

15. A method for preparing a display panel, configured to prepare the display panel of claim 10, wherein the method comprises:
providing the base substrate, wherein the base substrate comprises the display area and a non-display area at least partially surrounding the display area;
forming the active layer in the non-display area on a side of the base substrate using a deposition process, wherein the active layer comprises the fifth active portion and the sixth active portion connected to a side of the fifth active portion, the fifth active portion being configured to form the channel region for the tenth transistor;
forming the first conductive layer on a side, away from the base substrate, of the active layer using a deposition process, wherein the first conductive layer comprises the plurality of second gate lines and the plurality of transfer lines, wherein the orthographic projection of the second gate line on the base substrate covers the orthographic projection of the fifth active portion on the base substrate, and a portion of the second gate line is configured to form the gate for the tenth transistor, and wherein the transfer line is connected to the sixth conductive line and a corresponding data line in an adjacent pixel unit through via holes, respectively; and
forming the third conductive layer on a side, away from the base substrate, of the first conductive layer using a deposition process, wherein the third conductive layer comprises the plurality of data lines and the plurality of sixth conductive lines, wherein one of the plurality of data lines is connected to one column of sub-pixels, and wherein the plurality of sixth conductive lines are arranged in correspondence with the plurality of sixth active portions, and the sixth conductive line is connected to the sixth active portion through a via hole.

16. The method of claim 15, wherein, before forming the first conductive layer on the side, away from the base substrate, of the active layer using the deposition process, the method further comprises:

forming a first gate insulating layer by depositing a first inorganic material on the base substrate and the active layer using a deposition process; and wherein forming the first conductive layer on the side, away from the base substrate, of the active layer using the deposition process comprises:

forming the first conductive layer by depositing a first conductive material on the first gate insulating layer using the deposition process.

17. The method of claim 15, wherein, after forming the first conductive layer on the side, away from the base substrate, of the active layer using the deposition process, the method further comprises:

forming a second gate insulating layer by depositing a second inorganic material on the first conductive layer using a deposition process;

forming a second conductive layer by depositing a first conductive material on the second gate insulating layer using a deposition process;

forming a plurality of second transfer portions in the second conductive layer using a compositional process, wherein the plurality of second transfer portions are arranged in correspondence with the plurality of fifth active portions, an orthographic projection of the second transfer portion on the base substrate is between an orthographic projection of a fourth active portion on the base substrate and an orthographic projection of a second connection line on the base substrate, and the second transfer portion is connected to a corresponding third conductive line and a corresponding fourth conductive line through via holes, respectively;

forming an interlayer dielectric layer by depositing a first inorganic material or a second inorganic material on the second conductive layer using a deposition process; and forming a plurality of via holes in the interlayer dielectric layer using an etching process.

18. The method of claim 17, wherein forming the third conductive layer on the side, away from the base substrate, of the first conductive layer using the deposition process comprises:

forming the third conductive layer by depositing a second conductive material on the interlayer dielectric layer using the deposition process; and forming the plurality of data lines and the plurality of sixth conductive lines on the third conductive layer using an etching process.

19. The method of claim 18, wherein, after forming the third conductive layer, the method further comprises:

planarizing the third conductive layer.

20. A display device comprising the display panel of claim 1.

* * * * *